US008626110B2

(12) United States Patent
Cheng et al.

(10) Patent No.: US 8,626,110 B2
(45) Date of Patent: Jan. 7, 2014

(54) CIRCUIT ARRANGEMENT AND RECEIVER INCLUDING THE CIRCUIT ARRANGEMENT

(75) Inventors: Kuang-Wei Cheng, Singapore (SG); Minkyu Je, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/591,967

(22) Filed: Aug. 22, 2012

(65) Prior Publication Data

US 2013/0049839 A1 Feb. 28, 2013

(30) Foreign Application Priority Data

Aug. 23, 2011 (SG) ................................ 201106089-4

(51) Int. Cl.
*H04B 1/16* (2006.01)
(52) U.S. Cl.
USPC .......................... 455/343.2; 455/574; 370/311
(58) Field of Classification Search
USPC ............. 455/334, 343.1, 343.2, 574; 370/311
See application file for complete search history.

(56) References Cited

U.S. PATENT DOCUMENTS

| | | | | |
|---|---|---|---|---|
| 4,491,978 A | * | 1/1985 | Nagata et al. ............... | 455/343.1 |
| 6,654,604 B2 | * | 11/2003 | Yokogawa et al. ........... | 455/424 |
| 6,825,718 B2 | * | 11/2004 | Kang et al. ...................... | 330/86 |
| 6,973,334 B2 | * | 12/2005 | Katagishi et al. .......... | 455/550.1 |
| 7,536,153 B2 | * | 5/2009 | Uda et al. ...................... | 455/334 |

OTHER PUBLICATIONS

Pletcher, et al., A 2GHz 52 μW Wake-Up Receiver with -72dBm Sensitivity Using Uncertain-IF Architecture, 2008 IEEE Solid-State Circuits Conference Digest of Technical Papers, 524 (with supplement) (IEEESSCC 2008).
Proakis, et al., Digital Communications, 5th ed., 257 & 321, 2007.
Lee, The Design of CMOS Radio-Frequency Integrated Circuits, 2nd ed., 15, 2004.
Otis, et al., A 400 μW-RX, 1.6mW-TX Super-Regenerative Transceiver for Wireless Sensor Networks, 2005 IEEE Solid-State Circuits Conference Digest of Technical Papers, 396 (IEEESSCC 2005).
Curty, et al., Remotely Powered Addressable UHF RFID Integrated System, 40 IEEE J. Solid-State Circuits, 2193 (2005).
Jonsson, et al., RF Detector for On-Chip Amplitude Measurements, 40 Electronics Letters, 1239 (2004).

(Continued)

*Primary Examiner* — Quochien B Vuong
(74) *Attorney, Agent, or Firm* — K. David Crockett, Esq.; Niky Economy Syrengelas, Esq.; Crockett & Crockett, PC

(57) ABSTRACT

A circuit arrangement is provided. The circuit arrangement includes a first input terminal and a second input terminal, a first transistor and a second transistor coupled to each other and to the first input terminal and the second input terminal, each of the first transistor and the second transistor having a first controlled terminal, a second controlled terminal and a control terminal, an input matching circuit coupled to the first input terminal, the second input terminal, the first transistor and the second transistor, a first resistive element coupled between the control terminal and the second controlled terminal of the first transistor, a second resistive element coupled between the control terminal and the second controlled terminal of the second transistor, and an output terminal coupled to the second controlled terminals of the first transistor and the second transistor.

20 Claims, 8 Drawing Sheets

(56) References Cited

OTHER PUBLICATIONS

Shaeffer, et al., A 1.5-V, 1.5-GHz CMOS Low Noise Amplifier, 32 IEEE J. Solid-State Circuits, 745 (1997).
Cook, et al., Low-Power 2.4-GHz Transceiver With Passive RX Front-End and 400-mV Supply, 41 IEEE J. Solid-State Circuits, 2757 (2006).
Drago, et al., A 2.4GHz 830pJ/Bit Duty-Cycled Wake-Up Receiver with -82dBm Sensitivity for Crystal-Less Wireless Sensor Nodes, IEEE Solid-State Circuits Conference Digital Technical Papers, 224 (IEEESSCC 2010).
Huang, et al., A 2.4GHz/915MHz 51µW Wake-Up Receiver with Offset and Noise Suppression, IEEE Solid-State Circuits Conference Digital Technical Papers, 222 (IEEESSCC 2010).
ZarLink ZL70101 Data Sheet (Dec. 2009).

\* cited by examiner

CIRCUIT ARRANGEMENT AND RECEIVER INCLUDING THE CIRCUIT ARRANGEMENT

CROSS-REFERENCE TO RELATED APPLICATION

This application claims the benefit of priority of Singapore patent application No. 201106089-4, filed 23 Aug. 2011, the content of it being hereby incorporated by reference in its entirety for all purposes.

TECHNICAL FIELD

Various embodiments relate to a circuit arrangement, and a receiver including the circuit arrangement.

BACKGROUND

Reducing power consumption is always of the essence to ubiquitous wireless communication. For a low activity rate system, the natural method to take this advantage is duty-cycling turning on and off the device to reduce average power consumption so as to increase the battery life time by orders of magnitude. Following this trend, an always-on wake-up receiver (WuRx) 100, as shown in FIG. 1, becomes a firm demand used to continuously monitor the radio link for communication requests, e.g. between an antenna 102 and a data receiver 104, to power on the receiver 104 which is in deep sleep mode. As shown by the timing diagram 106, the wake-up receiver (WuRx) 100 continuously monitors the radio link or channel for communication requests for the main receiver 104, except during the period when there are communication requests for transmitting and receiving data, as shown by the timing diagrams 108, 110.

This auxiliary receiver, in the form of the wake-up receiver (WuRx) 100, breaks the trade-off between latency and average power consumption with only one receiver existing. Because the WuRx 100 is continuously monitoring the channel, its active power consumption must be very low. For those transceiver architectures that offer high efficiency communication but suffer from long synchronization time, such as radio-frequency identification (RFID), ultra-wideband (UWB) and electronic toll collection (ETC), WuRx are good candidates for wake-up based synchronization.

The early days' receiver was very simple, such as AM receivers, and can be implemented with an antenna, radio-frequency (RF) amplification and a nonlinear envelope detector to demodulate the signal. There are no power hungry local oscillators and mixers, which are found on the RF signal path, altogether in the frequency conversion counterpart nowadays. The envelope detector, usually implemented with a diode, is a popular choice because of its low power consumption. Envelope detectors have the inherent disadvantage of their quadratic nonlinearity that means a factor two drop in efficiency. Each drop of 10 dB in the input RF amplitude will result in a drop of 20 dB in the demodulated amplitude. This nature limits the sensitivity of the detector and of the overall receiver, owing to the signal dependent gain of the envelope detector. Indeed, the detector is the bottleneck of the receiver's sensitivity since it attenuates low level input signal and adds excessive noise. Not only high gain amplification for sensitivity but also narrowband filtering at RF for selectivity are required to overcome this limitation. However, the addition of RF gain stage is expensive from a power perspective. For example, more than 80% of the total receiver power is consumed at the gain stages, by the low noise amplifier (LNA), followed by the antenna and the channel-select amplifiers. The power breakdown illustrates the critical problem that large amounts of power are required at the RF gain stage. This prohibits further reduction in power consumption if the gain stage at higher carrier frequency is mandatory in certain applications.

There is another simple and low power wireless receiver candidate, a passive RFID tag, which does not even have a power supply. The RFID tag is inactive until it rectifies the remote RF energy from the reader to power up its own electronics and then to decode an incoming signal. In this way, the operation of the tag is very similar to the desired functionality of the WuRx. However, the rectifier has several drawbacks. The two main loss factors are from the threshold voltage of MOS diode and input parasitic capacitance of the rectifier. Hence, the communication range for the passive RFID tag is short, usually in the range of couples of centimeters, and the sensitivity is limited, at about −25.7 dBm on a 300 ohms antenna in the 2.4 GHz band. Although the RFID tag receiver features attractively low power consumption, a practical WuRx design will require much improvement to overcome the above addressed sensitivity and selectivity limitation.

Therefore, simple RFID receivers design does not satisfy the requirement for WuRx due to its low sensitivity, while conventional frequency conversion architectures are inherently too complicated and limited by power consumption. Clearly, the feasibility of implementing a WuRx receiver at high frequencies with low power dissipation represents a significant challenge.

SUMMARY

According to an embodiment, a circuit arrangement is provided. The circuit arrangement may include a first input terminal and a second input terminal, a first transistor and a second transistor, each of the first transistor and the second transistor having a first controlled terminal, a second controlled terminal and a control terminal, the first controlled terminal of the first transistor being coupled to the first controlled terminal of the second transistor, the control terminal of the first transistor being coupled to the first input terminal, the control terminal of the second transistor being coupled to the second input terminal, and the second controlled terminal of the first transistor being coupled to the second controlled terminal of the second transistor, an input matching circuit coupled to the first input terminal, the second input terminal, the first transistor and the second transistor, a first resistive element coupled between the control terminal of the first transistor and the second controlled terminal of the first transistor, a second resistive element coupled between the control terminal of the second transistor and the second controlled terminal of the second transistor, and an output terminal coupled to the second controlled terminal of the first transistor and the second controlled terminal of the second transistor, wherein the input matching circuit includes a first inductor, a second inductor, a third inductor, a first capacitor and a second capacitor, wherein the first inductor is coupled between the first input terminal and the control terminal of the first transistor, wherein the second inductor is coupled between the first controlled terminal of the first transistor and the first controlled terminal of the second transistor, wherein the third inductor is coupled between the second input terminal and the control terminal of the second transistor, wherein the first capacitor is coupled between the control terminal of the first transistor and the first controlled terminal of the first transistor, and wherein the second capacitor is coupled between the control terminal of the second transistor and the first controlled terminal of the second transistor.

According to an embodiment, a circuit arrangement is provided. The circuit arrangement may include a first input terminal and a second input terminal, a first transistor and a second transistor, each of the first transistor and the second transistor having a first controlled terminal, a second controlled terminal and a control terminal, the first controlled terminal of the first transistor being coupled to the first controlled terminal of the second transistor, the control terminal of the first transistor being coupled to the first input terminal, the control terminal of the second transistor being coupled to the second input terminal, and the second controlled terminal of the first transistor being coupled to the second controlled terminal of the second transistor, a third transistor and a fourth transistor, each of the third transistor and the fourth transistor having a first controlled terminal, a second controlled terminal and a control terminal, the first controlled terminal of the third transistor being coupled to the first controlled terminal of the fourth transistor, the control terminal of the third transistor being coupled to the first input terminal, the control terminal of the fourth transistor being coupled to the second input terminal, and the second controlled terminal of the third transistor being coupled to the second controlled terminal of the fourth transistor, an input matching circuit coupled to the first input terminal, the second input terminal, the first transistor, the second transistor, the third transistor and the fourth transistor, a first resistive element coupled between the control terminal of the first transistor and the second controlled terminal of the first transistor, a second resistive element coupled between the control terminal of the second transistor and the second controlled terminal of the second transistor, a third resistive element coupled between the control terminal of the third transistor and the second controlled terminal of the third transistor, a fourth resistive element coupled between the control terminal of the fourth transistor and the second controlled terminal of the fourth transistor, a first output terminal coupled to the second controlled terminal of the first transistor and the second controlled terminal of the second transistor, and a second output terminal coupled to the second controlled terminal of the third transistor and the second controlled terminal of the fourth transistor, wherein the input matching circuit includes a first inductor, a second inductor, a third inductor, a first capacitor, a second capacitor, a third capacitor and a fourth capacitor, wherein the first inductor includes a first terminal coupled to the first input terminal, and a second terminal coupled to the control terminal of the first transistor and the control terminal of the third transistor, wherein the second inductor includes a first terminal coupled to the first controlled terminal of the first transistor, the first controlled terminal of the second transistor, the first controlled terminal of the third transistor and the first controlled terminal of the fourth transistor, wherein the third inductor includes a first terminal coupled to the control terminal of the second transistor and the control terminal of the fourth transistor, and a second terminal coupled to the second input terminal, wherein the first capacitor is coupled between the control terminal of the first transistor and the first controlled terminal of the first transistor, wherein the second capacitor is coupled between the control terminal of the second transistor and the first controlled terminal of the second transistor, wherein the third capacitor is coupled between the control terminal of the third transistor and the first controlled terminal of the third transistor, and wherein the fourth capacitor is coupled between the control terminal of the fourth transistor and the first controlled terminal of the fourth transistor.

According to an embodiment, a receiver including the circuit arrangement as described herein is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
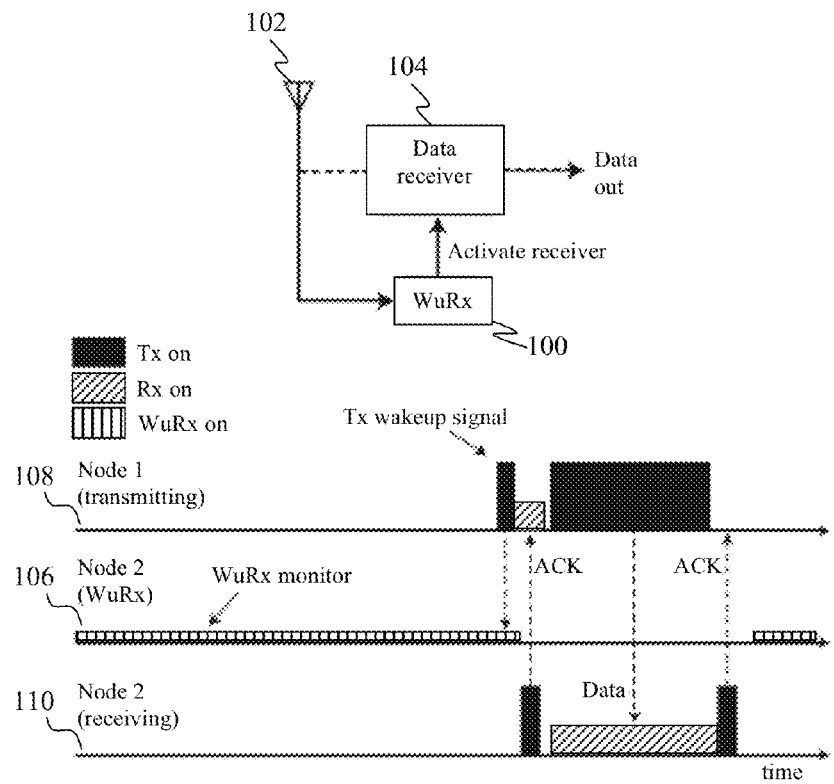
FIG. 1 shows a timing diagram of an always-on wake-up receiver (WuRx) of the prior art.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the devices are analogously valid for the other device.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the phrase "at least substantially" may include "exactly" and a variance of +/−5% thereof. As an example and not limitations, "A is at least substantially same as B" may encompass embodiments where A is exactly the same as B, or where A may be within a variance of +/−5%, for example of a value, of B, or vice versa.

In the context of various embodiments, the term "about" or "approximately" as applied to a numeric value encompasses the exact value and a variance of +/−5% of the value.

As used herein, the term "and/or" includes any and all combinations of one or more of the associated listed items.

Various embodiments may provide an approach based on an envelope detector with improved sensitivity and selectivity, without or with reduced at least some of the disadvantages of the prior art.

Various embodiments may provide circuit arrangements for active radio frequency (RF) detectors (e.g. envelope detectors). Various embodiments also provide an architecture, including a circuit arrangement, for wake-up receivers. The architecture includes an RF detector. The architecture may also include a continuous-time oversampling sigma-delta analogue-to-digital converter (CT ΣΔ ADC).

Various embodiments may provide an active radio frequency (RF) detector in an ultra-low power wake-up receiver (WuRx), for example for applications including electronic toll collection (ETC) systems. The receiver or transceiver may be utilized at the RF front-ends, employing a 5.8 GHz carrier frequency and an on-off keyed (OOK) modulation in wake-up requests. Other amplitude modulations such as amplitude-shift keying (ASK) may be employed. The receiver or transceiver may be designed for a sensitivity of about −70 dBm, operating at data rates up to 100 kbps, with a power consumption within 10 μW. However, it should be appreciated that other specifications and implementations of the RF detector and the WuRx may be possible, depending on the applications. As a further example, the WuRx of various embodiments may be employed as a universal remote control for existing receivers. In addition, the WuRx of various embodiments may be employed in wireless sensor networks or wireless communication systems. It should be appreciated that the WuRx of various embodiments may be employed in various applications which require μW-class power consumption.

Although other modulation methods such as frequency or phase modulation may provide better link efficiency, amplitude modulations such as the OOK allows substantial simplification of the RF demodulation, resulting in large power savings compared to more complex methods. Where a forward error correction (FEC) based correlation is also employed, a better robustness of the wake-up link may be achieved with minimum power overhead.

Figure 2A:
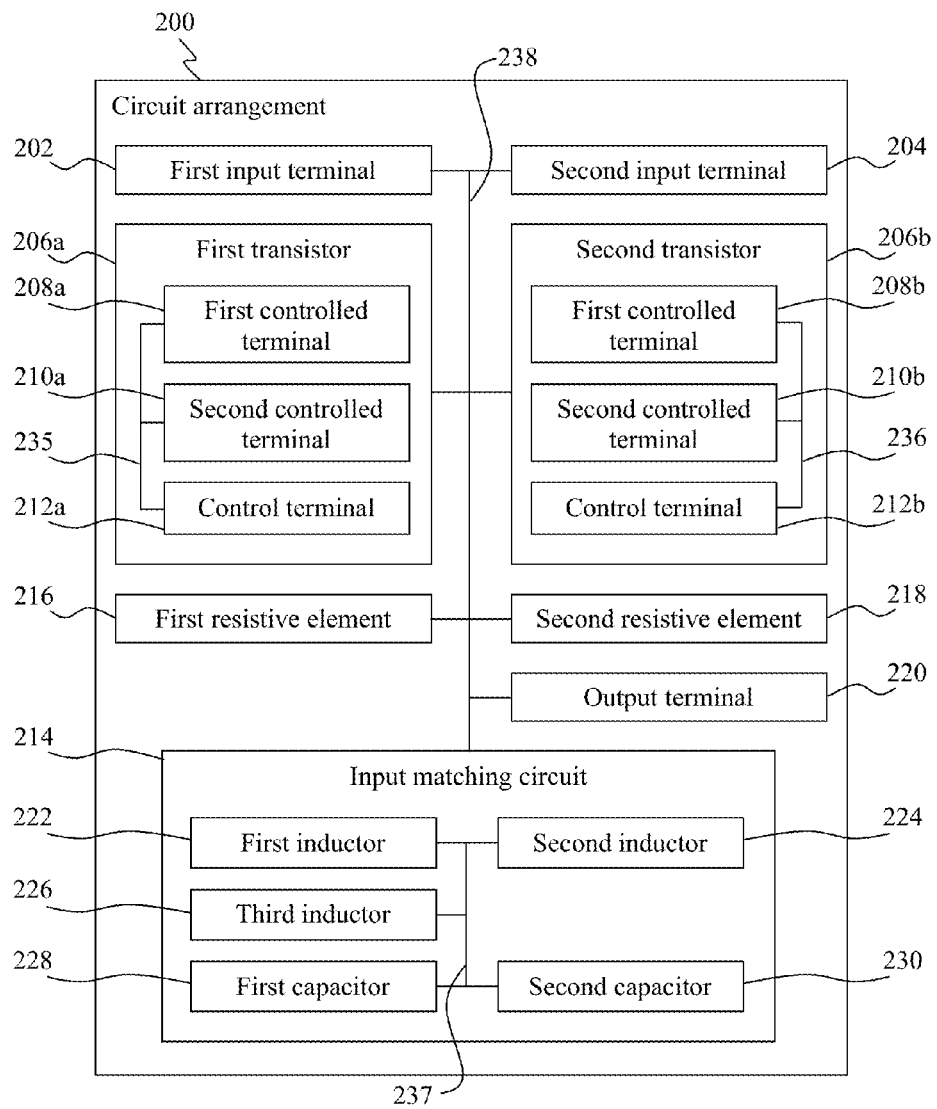
FIG. 2A shows a schematic block diagram of a circuit arrangement, according to various embodiments.

FIG. 2A shows a schematic block diagram of a circuit arrangement 200, according to various embodiments. The circuit arrangement 200 may be employed or included in a receiver, for example a wake-up receiver. The circuit arrangement 200 includes a first input terminal 202 (e.g. 406, FIG. 4) and a second input terminal 204 (e.g. 408, FIG. 4), a first transistor 206a (e.g. MN1 402a, FIG. 4) and a second transistor 206b (e.g. MN2 402b, FIG. 4), each of the first transistor 206a and the second transistor 206b having a first controlled terminal 208, a second controlled terminal 210 and a control terminal 212, the first controlled terminal 208a (e.g. 424a, FIG. 4) of the first transistor 206a being coupled to the first controlled terminal 208b (e.g. 424b, FIG. 4) of the second transistor 206b, the control terminal 212a (e.g. 428a, FIG. 4) of the first transistor 206a being coupled to the first input terminal 202, the control terminal 212b (e.g. 428b, FIG. 4) of the second transistor 206b being coupled to the second input terminal 204, and the second controlled terminal 210a (e.g. 426a, FIG. 4) of the first transistor 206a being coupled to the second controlled terminal 210b (e.g. 426b, FIG. 4) of the second transistor 206b. The circuit arrangement 200 further includes an input matching circuit 214 coupled to the first input terminal 202, the second input terminal 204, the first transistor 206a and the second transistor 206b.

The circuit arrangement 200 further includes a first resistive element 216 (e.g. Rf1 430, FIG. 4) coupled between the control terminal 212a of the first transistor 206a and the second controlled terminal 210a of the first transistor 206a, a second resistive element 218 (e.g. Rf2 432, FIG. 4) coupled between the control terminal 212b of the second transistor 206b and the second controlled terminal 210b of the second transistor 206b, and an output terminal 220 (e.g. 452, FIG. 4) coupled to the second controlled terminal 210a of the first transistor 206a and the second controlled terminal 210b of the second transistor 206b.

The input matching circuit 214 of the circuit arrangement 200 includes a first inductor 222 (e.g. Lg1 410, FIG. 4), a second inductor 224 (e.g. Ls 412, FIG. 4), a third inductor 226 (e.g. Lg2 414, FIG. 4), a first capacitor 228 (e.g. Cex1 416, FIG. 4) and a second capacitor 230 (e.g. Cex2 418, FIG. 4), wherein the first inductor 222 is coupled between the first input terminal 202 and the control terminal 212a of the first transistor 206a, wherein the second inductor 224 is coupled between the first controlled terminal 208a of the first transistor 206a and the first controlled terminal 208b of the second transistor 206b, wherein the third inductor 226 is coupled between the second input terminal 204 and the control terminal 212b of the second transistor 206b, wherein the first capacitor 228 is coupled between the control terminal 212a of the first transistor 206a and the first controlled terminal 208a of the first transistor 206a, and wherein the second capacitor 230 is coupled between the control terminal 212b of the second transistor 206b and the first controlled terminal 208b of the second transistor 206b.

In other words, the circuit arrangement 200 includes a pair of input terminals (202, 204), a pair of transistors (e.g. NMOS transistors) (206a, 206b), an input matching circuit (214) (or LC network/circuit) coupled to the pair of input terminals and the pair of transistors, a pair of resistive elements (216, 218) and an output terminal (220).

Each of the pair of transistors includes a first controlled terminal, a second controlled terminal and a control terminal, where the first controlled terminals of the pair of transistors are coupled to each other, the second controlled terminals of the pair of transistors are coupled to each other, the control terminal of one of the transistors is coupled to one of the input terminals, and the control terminal of the other transistor is coupled to the other input terminal. One of the resistive elements is coupled to the control terminal and the second controlled terminal of one transistor, while the other resistive element is coupled to the control terminal and the second controlled terminal of the other transistor. The output terminal is coupled to the second controlled terminals of the pair of transistors.

The input matching circuit includes a first inductor coupled to one input terminal and the control terminal of one transistor, a second inductor coupled to the first controlled terminals of the pair of transistors, a third inductor coupled to the other input terminal and the control terminal of the other transistor, a first capacitor coupled to the control terminal and the first controlled terminal of one transistor, and a second capacitor coupled to the control terminal and the first controlled terminal of the other transistor.

In FIG. 2A, the line represented as 235 is illustrated to show the relationship among the first controlled terminal 208a, the second controlled terminal 210a and the control terminal 212a of the first transistor 206a, which may include electrical coupling and/or mechanical coupling, the line represented as 236 is illustrated to show the relationship among the first controlled terminal 208b, the second controlled terminal 210b and the control terminal 212b of the second transistor 206b, which may include electrical coupling and/or mechanical coupling, the line represented as 237 is illustrated to show the relationship among the first inductor 222, the second inductor 224, the third inductor 226, the first capacitor 228 and the second capacitor 230 of the input matching circuit 214, which may include electrical coupling and/or mechanical coupling, while the line represented as 238 is illustrated to show the relationship among the first input terminal 202, the second input terminal 204, the first transistor 206a, the second transistor 206b, the input matching circuit 214, the first resistive element 216, the second resistive element 218 and the output terminal 220, which may include electrical coupling and/or mechanical coupling.

In various embodiments, the circuit arrangement 200 may further include a third capacitor (e.g. C1 420, FIG. 4) coupled in series with the first input terminal 202 and the first inductor 222 (e.g. coupled between the first input terminal 202 and the first inductor 222), and a fourth capacitor (e.g. C2 422, FIG. 4) coupled in series with the second input terminal 204 and the third inductor 226 (e.g. coupled between the second input terminal 204 and the third inductor 226).

In various embodiments, the first resistive element 216 (e.g. Rf1 430, FIG. 4) may include a third transistor (e.g. MPR1 434a, FIG. 4) and a fourth transistor (e.g. MPR2 434b, FIG. 4), each of the third transistor and the fourth transistor having a first controlled terminal, a second controlled terminal, a control terminal and a bulk terminal, wherein the first controlled terminal (e.g. 436a, FIG. 4) of the third transistor is coupled to the first controlled terminal (e.g. 436b, FIG. 4) of the fourth transistor, wherein the second controlled terminal (e.g. 438a, FIG. 4) of the third transistor is coupled to the control terminal 212a of the first transistor 206a, and the second controlled terminal (e.g. 438b, FIG. 4) of the fourth transistor is coupled to the second controlled terminal 210a of the first transistor 206a, wherein the bulk terminal (e.g. 441a, FIG. 4) of the third transistor is coupled to the second controlled terminal of the third transistor, and the bulk terminal (e.g. 441b, FIG. 4) of the fourth transistor is coupled to the second controlled terminal of the fourth transistor, and wherein the control terminal (e.g. 440a, FIG. 4) of the third transistor is coupled to the control terminal (e.g. 440b, FIG. 4) of the fourth transistor, the first controlled terminal of the third transistor and the first controlled terminal of the fourth transistor.

In various embodiments, the second resistive element 218 (e.g. Rf2 432, FIG. 4) may include a fifth transistor (e.g. MPR3 442a, FIG. 4) and a sixth transistor (e.g. MPR4 442b, FIG. 4), each of the fifth transistor and the sixth transistor having a first controlled terminal, a second controlled terminal, a control terminal and a bulk terminal, wherein the first controlled terminal (e.g. 444a, FIG. 4) of the fifth transistor is coupled to the first controlled terminal (e.g. 444b, FIG. 4) of the sixth transistor, wherein the second controlled terminal (e.g. 446a, FIG. 4) of the fifth transistor is coupled to the second controlled terminal 210b of the second transistor 206b, and the second controlled terminal (e.g. 446b, FIG. 4) of the sixth transistor is coupled to the control terminal 212b of the second transistor 206b, wherein the bulk terminal (e.g. 450a, FIG. 4) of the fifth transistor is coupled to the second controlled terminal of the fifth transistor, and the bulk terminal (e.g. 450b, FIG. 4) of the sixth transistor is coupled to the second controlled terminal of the sixth transistor, and wherein the control terminal (e.g. 448a, FIG. 4) of the fifth transistor is coupled to the control terminal (e.g. 448b, FIG. 4) of the sixth transistor, the first controlled terminal of the fifth transistor and the first controlled terminal of the sixth transistor.

In various embodiments, the circuit arrangement 200 may further include a current mirror circuit coupled to the second controlled terminal 210a of the first transistor 206a, the second controlled terminal 210b of the second transistor 206b, and the output terminal 220. The current mirror circuit may include a seventh transistor (e.g. MP2 462a, FIG. 4) and an eighth transistor (e.g. MP1 462b, FIG. 4), each of the seventh transistor and the eighth transistor having a first controlled terminal, a second controlled terminal and a control terminal, wherein the first controlled terminal (e.g. 464a, FIG. 4) of the seventh transistor and the first controlled terminal (e.g. 464b, FIG. 4) of the eighth transistor are coupled to a first voltage reference point (e.g. $V_1$, FIG. 4), wherein the control terminal (e.g. 468a, FIG. 4) of the seventh transistor is coupled to the control terminal (e.g. 468b, FIG. 4) of the eighth transistor, wherein the second controlled terminal (e.g. 466a, FIG. 4) of the seventh transistor is coupled to the second controlled terminal 210a of the first transistor 206a, the second controlled terminal 210b of the second transistor 206b and the output terminal 220, and wherein the second controlled terminal (e.g. 466b, FIG. 4) of the eighth transistor is coupled to the control terminal of the seventh transistor and the control terminal of the eighth transistor.

Figure 4:
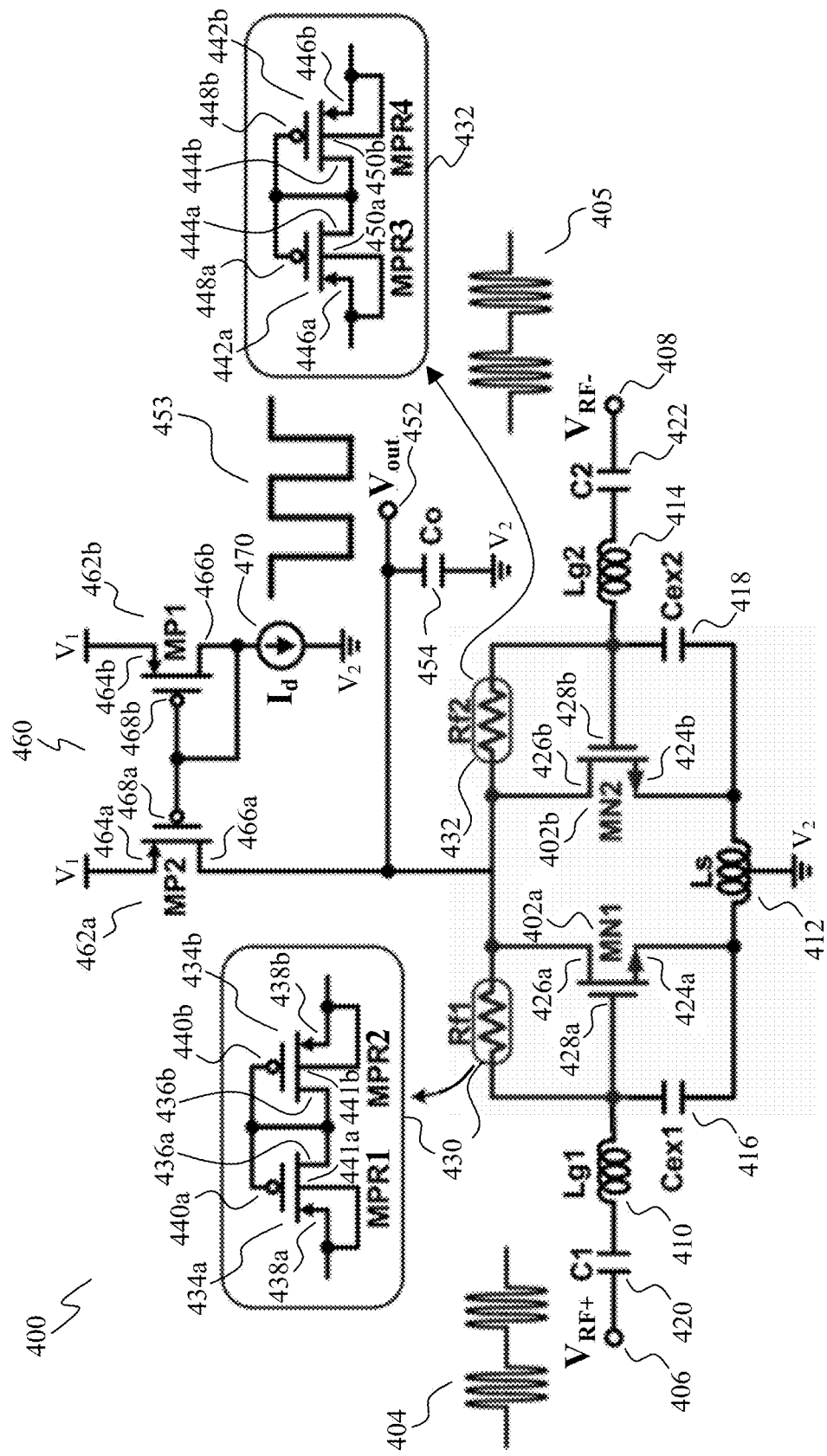
FIG. 4 shows a schematic of a circuit arrangement for a radio frequency (RF) detector, according to various embodiments.

In various embodiments, the circuit arrangement 200 may further include a current source (e.g. 470, FIG. 4) having a first terminal and a second terminal, wherein the first terminal of the current source is coupled to the control terminal of the seventh transistor, the control terminal of the eighth transistor and the second controlled terminal of the eighth transistor, and the second terminal of the current source is coupled to a second voltage reference point (e.g. $V_2$, FIG. 4).

In various embodiments, the circuit arrangement 200 may further include a fifth capacitor (e.g. Co 454, FIG. 4) having a first terminal and a second terminal, wherein the first terminal of the fifth capacitor is coupled to the second controlled terminal 210a of the first transistor 206a, the second controlled terminal 210b of the second transistor 206b, the output terminal 220 and the second controlled terminal of the seventh transistor, and the second terminal of the fifth capacitor is coupled to the second voltage reference point (e.g. $V_2$, FIG. 4).

In various embodiments, the second inductor may be further coupled to the second voltage reference point.

In the context of various embodiments of the circuit arrangement 200, the first voltage reference point may be a power supply line. In the context of various embodiments, the second voltage reference point may be a ground terminal.

In the context of various embodiments, the circuit arrangement 200 may include, may be part of or may be an envelope detector. The envelope detector or RF detector may be part of a receiver (e.g. wake-up receiver).

Various embodiments may provide a receiver including the circuit arrangement 200 as described above. The receiver may be or may include a wake-up receiver.

Various embodiments may provide a transceiver including the circuit arrangement 200 as described above. The transceiver may include a receiver (e.g. a wake-up receiver) having the circuit arrangement 200.

Figure 2B:
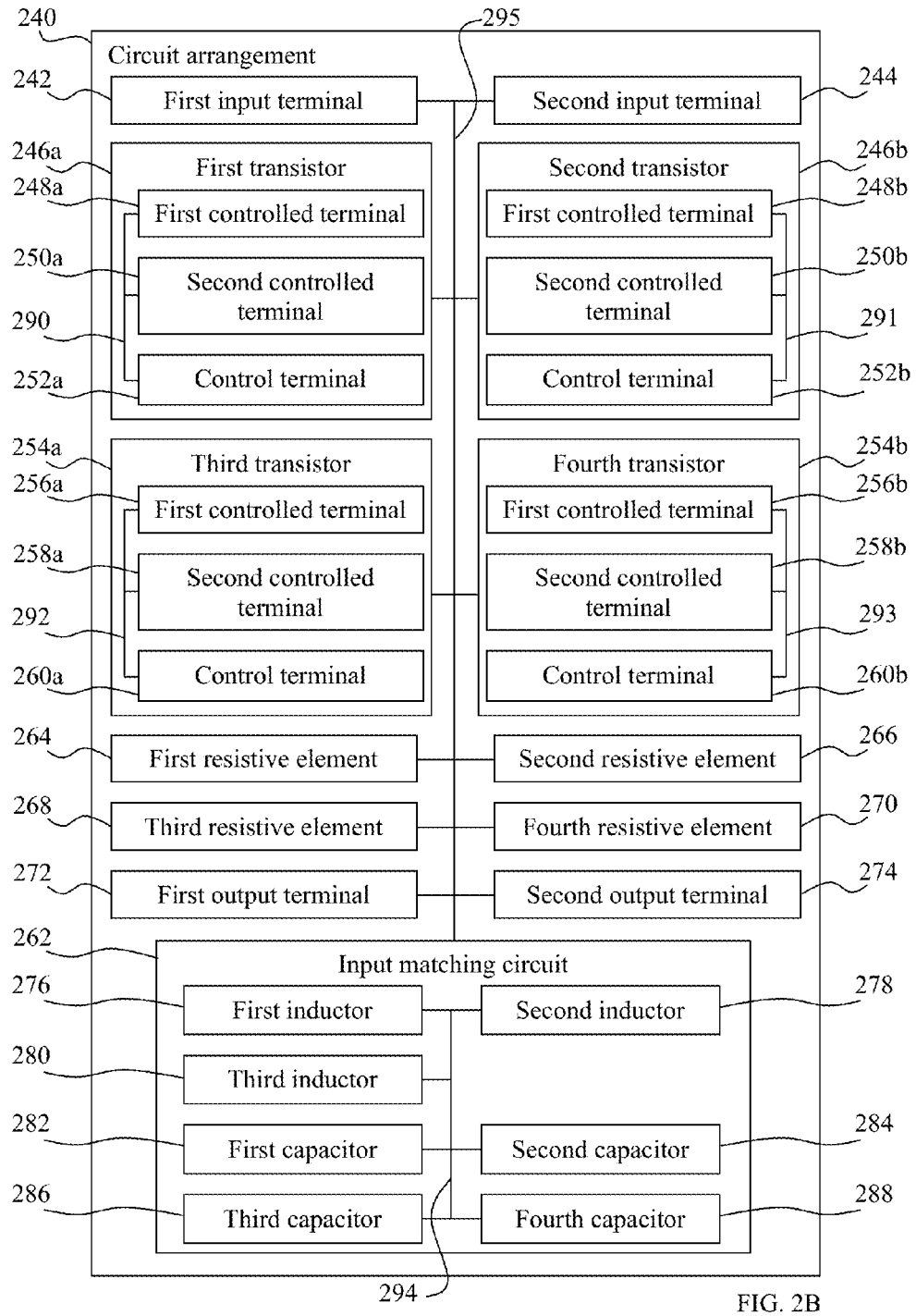
FIG. 2B shows a schematic block diagram of a circuit arrangement, according to various embodiments.

FIG. 2B shows a schematic block diagram of a circuit arrangement 240, according to various embodiments. The circuit arrangement 240 may be employed or included in a receiver, for example a wake-up receiver. The circuit arrangement 240 includes a first input terminal 242 (e.g. 1106, FIG. 11) and a second input terminal 244 (e.g. 1108, FIG. 11), a first transistor 246a (e.g. MN1 1102a, FIG. 11) and a second transistor 246b (e.g. MN2 1102b, FIG. 11), each of the first transistor 246a and the second transistor 246b having a first controlled terminal 248, a second controlled terminal 250 and a control terminal 252, the first controlled terminal 248a (e.g. 1118a, FIG. 11) of the first transistor 246a being coupled to the first controlled terminal 248b (e.g. 1118b, FIG. 11) of the second transistor 246b, the control terminal 252a (e.g. 1122a, FIG. 11) of the first transistor 246a being coupled to the first input terminal 242, the control terminal 252b (e.g. 1122b, FIG. 11) of the second transistor 246b being coupled to the second input terminal 244, and the second controlled terminal 250a (e.g. 1120a, FIG. 11) of the first transistor 246a being coupled to the second controlled terminal 250b (e.g. 1120b, FIG. 11) of the second transistor 246b.

The circuit arrangement 240 further includes a third transistor 254a (e.g. MP1 1124a, FIG. 11) and a fourth transistor 254b (e.g. MP2 1124b, FIG. 11), each of the third transistor 254a and the fourth transistor 254b having a first controlled terminal 256, a second controlled terminal 258 and a control terminal 260, the first controlled terminal 256a (e.g. 1126a, FIG. 11) of the third transistor 254a being coupled to the first controlled terminal 256b (e.g. 1126b, FIG. 11) of the fourth transistor 254b, the control terminal 260a (e.g. 1130a, FIG. 11) of the third transistor 254a being coupled to the first input terminal 242, the control terminal 260b (e.g. 1130b, FIG. 11) of the fourth transistor 254b being coupled to the second input terminal 244, and the second controlled terminal 258a (e.g. 1128a, FIG. 11) of the third transistor 254a being coupled to the second controlled terminal 258b (e.g. 1128b, FIG. 11) of the fourth transistor 254b.

The circuit arrangement 240 further includes an input matching circuit 262 coupled to the first input terminal 242, the second input terminal 244, the first transistor 246a, the second transistor 246b, the third transistor 254a and the fourth transistor 254b.

The circuit arrangement 240 further includes a first resistive element 264 (e.g. Rf1 1132, FIG. 11) coupled between the control terminal 252a of the first transistor 246a and the second controlled terminal 250a of the first transistor 246a, a second resistive element 266 (e.g. Rf2 1134, FIG. 11) coupled between the control terminal 252b of the second transistor 246b and the second controlled terminal 250b of the second transistor 246b, a third resistive element 268 (e.g. Rf3 1136, FIG. 11) coupled between the control terminal 260a of the third transistor 254a and the second controlled terminal 258a of the third transistor 254a, a fourth resistive element 270 (e.g. Rf4 1138, FIG. 11) coupled between the control terminal 260b of the fourth transistor 254b and the second controlled terminal 258b of the fourth transistor 254b.

The circuit arrangement 240 further includes a first output terminal 272 (e.g. 1182, FIG. 11) coupled to the second controlled terminal 250a of the first transistor 246a and the second controlled terminal 250b of the second transistor 246b, and a second output terminal 274 (e.g. 1184, FIG. 11) coupled to the second controlled terminal 258a of the third transistor 254a and the second controlled terminal 258b of the fourth transistor 254b.

The input matching circuit 262 of the circuit arrangement 240 includes a first inductor 276 (e.g. Lg1 1110, FIG. 11), a second inductor 278 (e.g. Ls 1111, FIG. 11), a third inductor 280 (e.g. Lg2 1112, FIG. 11), a first capacitor 282 (e.g. Cex1 1113, FIG. 11), a second capacitor 284 (e.g. Cex2 1114, FIG. 11), a third capacitor 286 (e.g. Cex3 1115, FIG. 11) and a fourth capacitor 288 (e.g. Cex4 1116, FIG. 11), wherein the first inductor 276 includes a first terminal coupled to the first input terminal 242, and a second terminal coupled to the control terminal 252a of the first transistor 246a and the control terminal 260a of the third transistor 254a, wherein the second inductor 278 includes a first terminal coupled to the first controlled terminal 248a of the first transistor 246a, the first controlled terminal 248b of the second transistor 246b, the first controlled terminal 256a of the third transistor 254a and the first controlled terminal 256b of the fourth transistor 254b, wherein the third inductor 280 includes a first terminal coupled to the control terminal 252b of the second transistor 246b and the control terminal 260b of the fourth transistor 254b, and a second terminal coupled to the second input terminal 244, wherein the first capacitor 282 is coupled between the control terminal 252a of the first transistor 246a and the first controlled terminal 248a of the first transistor 246a, wherein the second capacitor 284 is coupled between the control terminal 252b of the second transistor 246b and the first controlled terminal 248b of the second transistor 246b, wherein the third capacitor 286 is coupled between the control terminal 260a of the third transistor 254a and the first controlled terminal 256a of the third transistor 254a, and wherein the fourth capacitor 288 is coupled between the control terminal 260b of the fourth transistor 254b and the first controlled terminal 256b of the fourth transistor 254b.

In other words, the circuit arrangement 240 includes a pair of input terminals (242, 244), a first pair of transistors (e.g. NMOS transistors) (246a, 246b), a second pair of transistors (e.g. PMOS transistors) (254a, 254b), an input matching circuit (262) (or LC network/circuit) coupled to the pair of input terminals, the first pair of transistors and the second pair of transistors, four resistive elements (264, 266, 268, 270) and a pair of output terminals (272, 274).

Each transistor of the first pair of transistors includes a first controlled terminal, a second controlled terminal and a control terminal, where the first controlled terminals of the first pair of transistors are coupled to each other, the second controlled terminals of the first pair of transistors are coupled to each other, the control terminal of one of the transistors is coupled to one of the input terminals, and the control terminal of the other transistor is coupled to the other input terminal.

Each transistor of the second pair of transistors includes a first controlled terminal, a second controlled terminal and a control terminal, where the first controlled terminals of the second pair of transistors are coupled to each other, the second controlled terminals of the second pair of transistors are coupled to each other, the control terminal of one of the transistors is coupled to one of the input terminals, and the control terminal of the other transistor is coupled to the other input terminal.

A first resistive element of the four resistive elements is coupled to the control terminal and the second controlled terminal of one transistor of the first pair of transistors. A second resistive element coupled to the control terminal and the second controlled terminal of the other transistor of the first pair of transistors. A third resistive element is coupled to the control terminal and the second controlled terminal of one transistor of the second pair of transistors. A fourth resistive element is coupled to the control terminal and the second controlled terminal of the other transistor of the second pair of transistors.

One of the output terminals is coupled to the second controlled terminals of the first pair of transistors, while the other output terminal is coupled to the second controlled terminals of the second pair of transistors.

The input matching circuit includes a first inductor coupled to one input terminal, the control terminal of one transistor of the first pair of transistors and the control terminal of one transistor of the second pair of transistors, a second inductor coupled to the first controlled terminals of the first and second pairs of transistors, a third inductor coupled to the other input terminal, the control terminal of the other transistor of the first pair of transistors and the control terminal of the other transistor of the second pair of transistors, a first capacitor coupled to the control terminal and the first controlled terminal of one transistor of the first pair of transistors, a second capacitor coupled to the control terminal and the first controlled terminal of the other transistor of the first pair of transistors, a third capacitor coupled to the control terminal and the first controlled terminal of one transistor of the second pair of transistors, and a fourth capacitor coupled to the control terminal and the first controlled terminal of the other transistor of the second pair of transistors.

In FIG. 2B, the line represented as 290 is illustrated to show the relationship among the first controlled terminal 248a, the second controlled terminal 250a and the control terminal 252a of the first transistor 246a, which may include electrical coupling and/or mechanical coupling, the line represented as 291 is illustrated to show the relationship among the first controlled terminal 248b, the second controlled terminal 250b and the control terminal 252b of the second transistor 246b, which may include electrical coupling and/or mechanical coupling, the line represented as 292 is illustrated to show the relationship among the first controlled terminal 256a, the second controlled terminal 258a and the control terminal 260a of the third transistor 254a, which may include electrical coupling and/or mechanical coupling, the line represented as 293 is illustrated to show the relationship among the first controlled terminal 256b, the second controlled terminal 258b and the control terminal 260b of the fourth transistor 254b, which may include electrical coupling and/or mechanical coupling, the line represented as 294 is illustrated to show the relationship among the first inductor 276, the second inductor 278, the third inductor 280, the first capacitor 282, the second capacitor 284, the third capacitor 286 and the fourth capacitor 288 of the input matching circuit 262, which may include electrical coupling and/or mechanical coupling, while the line represented as 295 is illustrated to show the relationship among the first input terminal 242, the second input terminal 244, the first transistor 246a, the second transistor 246b, the third transistor 254a, the fourth transistor 254b, the input matching circuit 262, the first resistive element 264, the second resistive element 266, the third resistive element 268, the fourth resistive element 270, the first output terminal 272 and the second output terminal 274, which may include electrical coupling and/or mechanical coupling.

Figure 11:
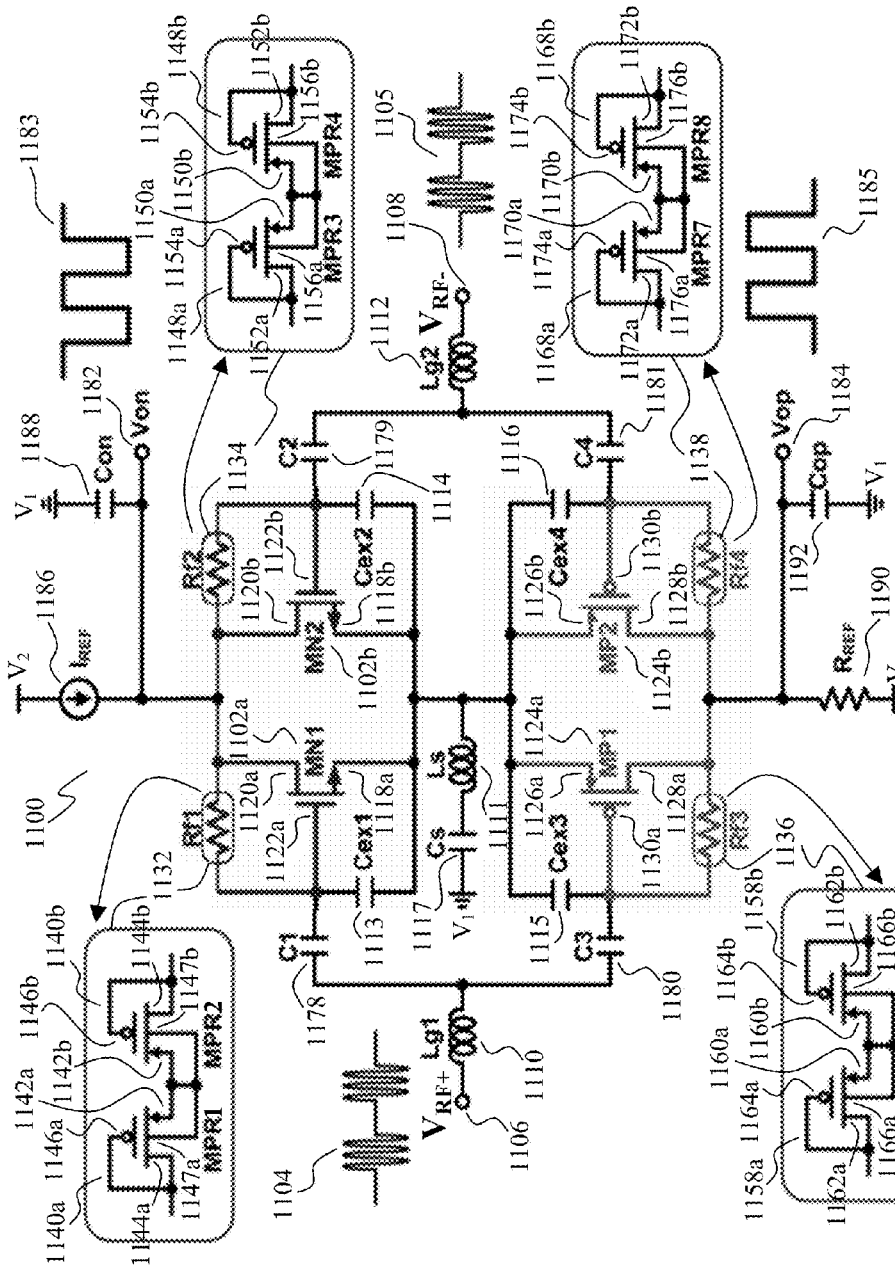
FIG. 11 shows a schematic of a circuit arrangement for a radio frequency (RF) detector, according to various embodiments.

In various embodiments, the input matching circuit 262 may further include a fifth capacitor (e.g. Cs 1117, FIG. 11) having a first terminal and a second terminal, wherein the first terminal of the fifth capacitor is coupled to a second terminal of the second inductor 278 of the input matching circuit 262, and the second terminal of the fifth capacitor is coupled to a first voltage reference point (e.g. $V_1$, FIG. 11).

In various embodiments, the circuit arrangement 240 may further include a sixth capacitor (e.g. C1 1178, FIG. 11) coupled in series with the first inductor 276 and the control terminal 252a of the first transistor 246a (e.g. coupled between the second terminal of the first inductor 276 and the control terminal 252a of the first transistor 246a), a seventh capacitor (e.g. C2 1179, FIG. 11) coupled in series with the third inductor 280 and the control terminal 252b of the second transistor 246b (e.g. coupled between the first terminal of the third inductor 280 and the control terminal 252b of the second transistor 246b), an eighth capacitor (e.g. C3 1180, FIG. 11) coupled in series with the first inductor 276 and the control terminal 260a of the third transistor 254a (e.g. coupled between the second terminal of the first inductor 276 and the control terminal 260a of the third transistor 254a), and a ninth capacitor (e.g. C4 1181, FIG. 11) coupled in series with the third inductor 280 and the control terminal 260b of the fourth transistor 254b (e.g. coupled between the first terminal of the third inductor 280 and the control terminal 260b of the fourth transistor 254b).

In various embodiments, the first resistive element 264 (e.g. Rf1 1132, FIG. 11) includes a fifth transistor (e.g. MPR1 1140a, FIG. 11) and a sixth transistor (e.g. MPR2 1140b, FIG. 11), each of the fifth transistor and the sixth transistor having a first controlled terminal, a second controlled terminal, a control terminal and a bulk terminal, wherein the first controlled terminal (e.g. 1142a, FIG. 11) of the fifth transistor is coupled to the first controlled terminal (e.g. 1142b, FIG. 11) of the sixth transistor, wherein the second controlled terminal (e.g. 1144a, FIG. 11) of the fifth transistor is coupled to the control terminal 252a of the first transistor 246a, and the second controlled terminal (e.g. 1144b, FIG. 11) of the sixth transistor is coupled to the second controlled terminal 250a of the first transistor 246a, wherein the control terminal (e.g. 1146a, FIG. 11) of the fifth transistor is coupled to the second controlled terminal of the fifth transistor, and the control terminal (e.g. 1146b, FIG. 11) of the sixth transistor is coupled to the second controlled terminal of the sixth transistor, and wherein the bulk terminal (e.g. 1147a, FIG. 11) of the fifth transistor is coupled to the bulk terminal (e.g. 1147b, FIG. 11) of the sixth transistor, the first controlled terminal of the fifth transistor and the first controlled terminal of the sixth transistor.

In various embodiments, the second resistive element 266 (e.g. Rf2 1134, FIG. 11) includes a seventh transistor (e.g. MPR3 1148a, FIG. 11) and an eighth transistor (e.g. MPR4 1148b, FIG. 11), each of the seventh transistor and the eighth transistor having a first controlled terminal, a second controlled terminal, a control terminal and a bulk terminal, wherein the first controlled terminal (e.g. 1150a, FIG. 11) of the seventh transistor is coupled to the first controlled terminal (e.g. 1150b, FIG. 11) of the eighth transistor, wherein the second controlled terminal (e.g. 1152a, FIG. 11) of the seventh transistor is coupled to the second controlled terminal 250b of the second transistor 246b, and the second controlled terminal (e.g. 1152b, FIG. 11) of the eighth transistor is coupled to the control terminal 252b of the second transistor 246b, wherein the control terminal (e.g. 1154a, FIG. 11) of the seventh transistor is coupled to the second controlled terminal of the seventh transistor, and the control terminal (e.g. 1154b, FIG. 11) of the eighth transistor is coupled to the second controlled terminal of the eighth transistor, and wherein the bulk terminal (e.g. 1156a, FIG. 11) of the seventh transistor is coupled to the bulk terminal (e.g. 1156b, FIG. 11) of the eighth transistor, the first controlled terminal of the seventh transistor and the first controlled terminal of the eighth transistor.

In various embodiments, the third resistive element 268 (e.g. Rf3 1136, FIG. 11) includes a ninth transistor (e.g. MPR5 1158a, FIG. 11) and a tenth transistor (e.g. MPR6 1158b, FIG. 11), each of the ninth transistor and the tenth transistor having a first controlled terminal, a second controlled terminal, a control terminal and a bulk terminal, wherein the first controlled terminal (e.g. 1160a, FIG. 11) of the ninth transistor is coupled to the first controlled terminal (e.g. 1160b, FIG. 11) of the tenth transistor, wherein the second controlled terminal (e.g. 1162a, FIG. 11) of the ninth transistor is coupled to the control terminal 260a of the third transistor 254a, and the second controlled terminal (e.g. 1162b, FIG. 11) of the tenth transistor is coupled to the second controlled terminal 258a of the third transistor 254a, wherein the control terminal (e.g. 1164a, FIG. 11) of the ninth transistor is coupled to the second controlled terminal of the ninth transistor, and the control terminal (e.g. 1164b, FIG. 11) of the tenth transistor is coupled to the second controlled terminal of the tenth transistor, and wherein the bulk terminal (e.g. 1166a, FIG. 11) of the ninth transistor is coupled to the bulk terminal (e.g. 1166b, FIG. 11) of the tenth transistor, the first controlled terminal of the ninth transistor and the first controlled terminal of the tenth transistor.

In various embodiments, the fourth resistive element 270 (e.g. Rf4 1138, FIG. 11) includes an eleventh transistor (e.g. MPR7 1168a, FIG. 11) and a twelfth transistor (e.g. MPR8 1168b, FIG. 11), each of the eleventh transistor and the twelfth transistor having a first controlled terminal, a second controlled terminal, a control terminal and a bulk terminal, wherein the first controlled terminal (e.g. 1170a, FIG. 11) of the eleventh transistor is coupled to the first controlled terminal (e.g. 1170b, FIG. 11) of the twelfth transistor, wherein the second controlled terminal (e.g. 1172a, FIG. 11) of the eleventh transistor is coupled to the second controlled terminal 258b of the fourth transistor 254b, and the second controlled terminal (e.g. 1172b, FIG. 11) of the twelfth transistor is coupled to the control terminal 260b of the fourth transistor 254b, wherein the control terminal (e.g. 1174a, FIG. 11) of the eleventh transistor is coupled to the second controlled terminal of the eleventh transistor, and the control terminal (e.g. 1174b, FIG. 11) of the twelfth transistor is coupled to the second controlled terminal of the twelfth transistor, and wherein the bulk terminal (e.g. 1176a, FIG. 11) of the eleventh transistor is coupled to the bulk terminal (e.g. 1176b, FIG. 11) of the twelfth transistor, the first controlled terminal of the eleventh transistor and the first controlled terminal of the twelfth transistor.

In various embodiments, the circuit arrangement 240 may further include a current source (e.g. 1186, FIG. 11) having a first terminal and a second terminal, wherein the first terminal of the current source is coupled to the second controlled terminal 250a of the first transistor 246a, the second controlled terminal 250b of the second transistor 246b and the first output terminal 272, and the second terminal of the current source is coupled to a second voltage reference point (e.g. $V_2$, FIG. 11).

In various embodiments, the circuit arrangement 240 may further include a tenth capacitor (e.g. Con 1188, FIG. 11) having a first terminal and a second terminal, wherein the first terminal of the tenth capacitor is coupled to the first terminal of the current source and the first output terminal 272, and the second terminal of the tenth capacitor is coupled to the first voltage reference point (e.g. $V_1$, FIG. 11).

In various embodiments, the circuit arrangement 240 may further include a resistor (e.g. $R_{REF}$ 1190, FIG. 11) having a first terminal and a second terminal, wherein the first terminal of the resistor is coupled to the second controlled terminal 258a of the third transistor 254a, the second controlled terminal 258b of the fourth transistor 254b and the second output terminal 274, and the second terminal of the resistor is coupled to a first voltage reference point (e.g. $V_1$, FIG. 11).

In various embodiments, the circuit arrangement 240 may further include an eleventh capacitor (e.g. Cop 1192, FIG. 11) having a first terminal and a second terminal, wherein the first terminal of the eleventh capacitor is coupled to the first terminal of the resistor and the second output terminal 274, and the second terminal of the eleventh capacitor is coupled to the first voltage reference point (e.g. $V_1$, FIG. 11).

In the context of various embodiments of the circuit arrangement 240, the first voltage reference point may be a ground terminal. In the context of various embodiments, the second voltage reference point may be a power supply line.

In the context of various embodiments, the circuit arrangement 240 may include, may be part of or may be an envelope detector. The envelope detector or RF detector may be part of a receiver (e.g. wake-up receiver).

Various embodiments may provide a receiver including the circuit arrangement 240 as described above. The receiver may be or may include a wake-up receiver.

Various embodiments may provide a transceiver including the circuit arrangement 240 as described above. The transceiver may include a receiver (e.g. a wake-up receiver) having the circuit arrangement 240.

In the context of various embodiments, each of the first transistor (e.g. 206a, 246a) and the second transistor (e.g. 206b, 246b) may be or may include an n-type metal oxide semiconductor field effect transistor (e.g. NMOS transistor).

In the context of various embodiments, each of the third transistor (e.g. 254a) and the fourth transistor (e.g. 254b) may be or may include a p-type metal oxide semiconductor field effect transistor (e.g. PMOS transistor).

In the context of various embodiments, each of the fifth transistor and the sixth transistor may be or may include a p-type metal oxide semiconductor field effect transistor (e.g. PMOS transistor).

In the context of various embodiments, each of the seventh transistor and the eighth transistor may be or may include a p-type metal oxide semiconductor field effect transistor (e.g. PMOS transistor).

In the context of various embodiments, each of the ninth transistor and the tenth transistor may be or may include a p-type metal oxide semiconductor field effect transistor (e.g. PMOS transistor).

In the context of various embodiments, each of the eleventh transistor and the twelfth transistor may be or may include a p-type metal oxide semiconductor field effect transistor (e.g. PMOS transistor).

In the context of various embodiments, the term "transistor" may include a field effect transistor (FET), such as one of a metal oxide semiconductor field effect transistor (MOSFET) (e.g. an n-channel MOS transistor (NMOS), a p-channel MOS transistor (PMOS)), a metal-insulator field effect transistor (MISFET) or a metal-semiconductor field effect transistor (MESFET).

In the context of various embodiments, the term "controlled terminal" may include or may mean a "source/drain terminal", such that the term "first controlled terminal" may mean a "first source/drain terminal" and the term "second controlled terminal" may mean a "second source/drain terminal".

In the context of various embodiments, the terms "controlled terminal" or "source/drain terminal" of a transistor may refer to a source terminal or a drain terminal. As the source terminal and the drain terminal of a transistor are generally fabricated such that these terminals are geometrically symmetrical, these terminals may be collectively referred to as controlled terminals or source/drain terminals. In various embodiments, a particular controlled terminal or source/drain terminal may be a "source" terminal or a "drain" terminal depending on the voltage to be applied to that terminal.

In the context of various embodiments, the term "control terminal" may include or may mean a gate terminal.

In the context of various embodiments, the term "bulk terminal" may mean a substrate terminal for N-channel MOS transistors and a well terminal for P-channel MOS transistors.

In the context of various embodiments, the term "matching circuit" may include or may mean an impedance matching circuit that at least substantially matches the impedance of one part of a circuit (e.g. a source) with the impedance of another part of the circuit (e.g. a load) so as to maximize the power transfer between the two parts of the circuit or minimize reflections from the load. The matching circuit may include one or more inductors (L) and/or one or more capacitors (C). Therefore, the matching circuit may be an LC circuit.

In the context of various embodiments, the term "envelope detector" may include or may mean a circuit that receives an input signal and provides an output which is the envelope of the input signal.

In the context of various embodiments, the term "current source" may include, for example, a direct or indirect current source, or a current mirror, or a constant or variable current source, or a voltage bias.

In the context of various embodiments, the term "current mirror circuit" may mean a circuit that serves as a current regulator, where the current flowing in one half or branch of the circuit is used to control the current flow in the other half or branch of the circuit. The current amplitude flowing through both halves or branches is at least substantially same.

In the context of various embodiments, a reference to the term "coupled" with regard to two or more components may include a reference to "directly coupled" or "indirectly coupled", e.g. including one or more other components (e.g. resistor and/or inductor and/or capacitor) connected therebetween the two or more components.

In the context of various embodiments, the term "coupled" may include electrical coupling and/or mechanical coupling.

Figure 3:
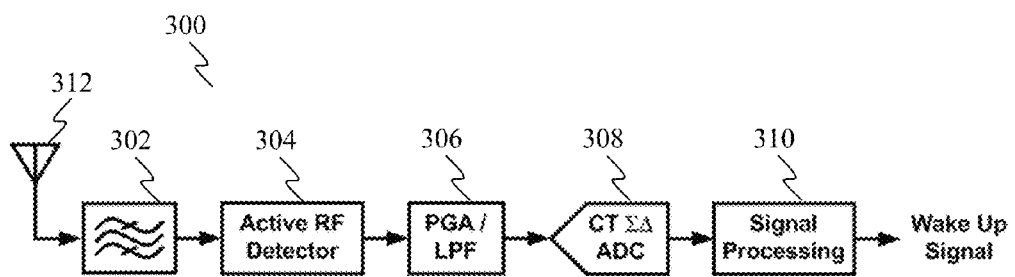
FIG. 3 shows a schematic block diagram of a wake-up receiver (WuRx), according to various embodiments.

FIG. 3 shows a schematic block diagram of a wake-up receiver (WuRx) 300, according to various embodiments. The wake-up receiver (WuRx) 300 includes a bandpass filter 302, an active radio frequency (RF) detector (e.g. amplitude detector or envelope detector) 304, a programmable-gain amplifier (PGA) and a low pass filter (LPF), collectively shown by the block 306, a continuous-time sigma-delta analogue-to-digital converter (CT ΣΔ ADC) 308 and a signal processing module or circuit 310.

The wake-up receiver (WuRx) 300 may receive an on-off keying (OOK) input signal (e.g. a 5.8 GHz RF input signal) from an antenna (e.g. a 50Ω antenna) 312, in which the input signal passes through the bandpass filter 302 for obtaining the desired RF band. The bandpass filter 302 is collaborated with the RF detector 304, which may be co-design with an input matching network or circuit, in which the analog front-end or the RF detector 304 converts the OOK input signal directly into baseband signals. The baseband signals are amplified with programmable gain and lowpass filtered with variable bandwidth, by the PGA/LPF block 306, and digitized by the CT ΣΔ ADC 308 to reduce noise of the circuit or system. The CT ΣΔ ADC 308 oversamples the wake-up request signals to increase the signal to noise ratio (SNR). The output of the ADC 308 is digitally processed by the signal processing circuit 310, which may include a decimation filter and an error correction correlation receiver, to generate wake-up requests or signals. Therefore, the digital back-end processing is compliant with decimation filters.

FIG. 4 shows a schematic of a circuit arrangement 400 for a radio frequency (RF) detector, according to various embodiments. The circuit arrangement 400 may be implemented, for example, for the active radio frequency (RF) detector (e.g. amplitude detector or envelope detector) 304 (FIG. 3). The circuit arrangement 400 includes two parts: an amplitude detector based on the nonlinear behavior of MOS devices at the transition from weak to strong inversion, and an LC (inductor-capacitor) network for input matching. The LC network may also function as an RF filter (e.g. as the bandpass filter 302, FIG. 3).

The circuit arrangement 400 includes transistors (e.g. NMOS transistors) MN1 402a and MN2 402b, which form a pseudo-differential pair to sense differential inputs $V_{RF+}$ 404, $V_{RF-}$ 405, received through a "positive" input terminal 406 and a "negative" input terminal 408, which are robust to common mode noise, and which are matched to an antenna (e.g. 312, FIG. 3) (not shown) with a matching circuit of an LC network having the inductors (L) Lg1 410, Ls 412, Lg2 414, and the capacitors (C) Cex1 416 and Cex2 418. The matching circuit is coupled to the input terminal 406, the input terminal 408, the transistor MN1 402a and the transistor MN2 402b.

The circuit arrangement 400 includes a capacitor C1 420 coupled in series with the input terminal 406 and the inductor Lg1 410 (e.g. coupled between the input terminal 406 and the inductor Lg1 410), and a capacitor C2 422 coupled in series with the input terminal 408 and the inductor Lg2 414 (e.g. coupled between the second input terminal 204 and the third inductor 226 the input terminal 408 and the inductor Lg2 414).

The transistor MN1 402a includes a first controlled terminal (e.g. source terminal) 424a, a second controlled terminal (e.g. drain terminal) 426a and a control terminal (e.g. gate terminal) 428a, and the transistor MN2 402b includes a first controlled terminal (e.g. source terminal) 424b, a second controlled terminal (e.g. drain terminal) 426b and a control terminal (e.g. gate terminal) 428b.

The first controlled terminals 424a, 424b are coupled to each other. The second controlled terminals 426a, 426b are coupled to each other. The control terminal 428a is coupled to the input terminal 406 and the control terminal 428b is coupled to the input terminal 408. The control terminal 428a is also coupled to the inductor Lg1 410 and the capacitor C1 420. The control terminal 428b is also coupled to the inductor Lg2 414 and the capacitor C2 422.

As illustrated in FIG. 4, the inductor Lg1 410 is coupled between the input terminal 406 and the control terminal 428a, the inductor Ls 412 is coupled between the first controlled terminals 424a, 424b, the inductor Lg2 414 is coupled between the input terminal 408 and the control terminal 428b, the capacitor Cex1 416 is coupled between the control terminal 428a and the first controlled terminal 424a, and the capacitor Cex2 418 is coupled between the control terminal 428b and the first controlled terminal 424b. The inductor Ls 412 is also coupled to a voltage reference point $V_2$, which may be a ground terminal.

The circuit arrangement 400 further includes a resistive element Rf1 430 coupled between the control terminal 428a and the second controlled terminal 426a, and a resistive element Rf2 432 coupled between the control terminal 428b and the second controlled terminal 426b. The resistive element Rf1 430 and the resistive element Rf2 432 may be at least substantially same.

The resistive element Rf1 430 includes transistors (e.g. PMOS transistors) MPR1 434a and MPR2 434b. The transistor MPR1 434a includes a first controlled terminal (e.g. source terminal) 436a, a second controlled terminal (e.g. drain terminal) 438a, a control terminal (e.g. gate terminal) 440a, and a bulk terminal 441a, and the transistor MPR2 434b includes a first controlled terminal (e.g. source terminal)

436b, a second controlled terminal (e.g. drain terminal) 438b, a control terminal (e.g. gate terminal) 440b, and a bulk terminal 441b.

The first controlled terminals 436a, 436b are coupled to each other. The second controlled terminal 438a of the transistor MPR1 434a is coupled to the control terminal 428a of the transistor MN1 402a. The second controlled terminal 438b of the transistor MPR2 434b is coupled to the second controlled terminal 426a of the transistor MN1 402a. The bulk terminal 441a is coupled to the second controlled terminal 438a. The bulk terminal 441b is coupled to the second controlled terminal 438b. The control terminals 440a, 440b are coupled to each other and also coupled to the first controlled terminals 436a, 436b.

The resistive element Rf2 432 includes transistors (e.g. PMOS transistors) MPR3 442a and MPR4 442b. The transistor MPR3 442a includes a first controlled terminal (e.g. source terminal) 444a, a second controlled terminal (e.g. drain terminal) 446a, a control terminal (e.g. gate terminal) 448a, and a bulk terminal 450a, and the transistor MPR4 442b includes a first controlled terminal (e.g. source terminal) 444b, a second controlled terminal (e.g. drain terminal) 446b, a control terminal (e.g. gate terminal) 448b, and a bulk terminal 450b.

The first controlled terminals 444a, 444b are coupled to each other. The second controlled terminal 446a of the transistor MPR3 442a is coupled to the second controlled terminal 426b of the transistor MN2 402b. The second controlled terminal 446b of the transistor MPR4 442b is coupled to the control terminal 428b of the transistor MN2 402b. The bulk terminal 450a is coupled to the second controlled terminal 446a. The bulk terminal 450b is coupled to the second controlled terminal 446b. The control terminals 448a, 448b are coupled to each other and also coupled to the first controlled terminals 444a, 444b.

It should be appreciated that any one or each of the resistive element Rf1 430 and resistive element Rf2 432 may also be at least substantially same, for example in terms of the arrangements of the PMOS transistors, as any one of the resistive element Rf1 1132 (FIG. 11), the resistive element Rf2 1134 (FIG. 11), the resistive element Rf3 1136 (FIG. 11) or the resistive element Rf4 1138 (FIG. 11) to be described later.

The circuit arrangement 400 further includes an output terminal 452, from which an output signal (e.g. a baseband signal) $V_{out}$ 453 may be extracted, coupled to the second controlled terminals 426a, 426b. The circuit arrangement 400 may further include a capacitor Co 454, wherein a first terminal of the capacitor Co 454 is coupled to the second controlled terminals 426a, 426b, and the output terminal 452, and a second terminal of the capacitor Co 454 is coupled to a voltage reference point $V_2$, which may be a ground terminal.

The circuit arrangement 400 may further include a current mirror circuit 460 coupled to the second controlled terminal 426a of the transistor MN1 402a, the second controlled terminal 426b of the MN2 402b, and the output terminal 452.

The current mirror circuit includes transistors (e.g. PMOS transistors) MP2 462a and MP1 462b. The transistor MP2 462a includes a first controlled terminal (e.g. source terminal) 464a, a second controlled terminal (e.g. drain terminal) 466a, and a control terminal (e.g. gate terminal) 468a, and the transistor MP1 462b includes a first controlled terminal (e.g. source terminal) 464b, a second controlled terminal (e.g. drain terminal) 466b, and a control terminal (e.g. gate terminal) 468b.

Each of the first controlled terminals 464a, 464b is coupled to a voltage reference point $V_1$, which may be a power supply line. The control terminals 468a, 468b are coupled to each other. The second controlled terminal 466a of the transistor MP2 462a is coupled to the second controlled terminal 426a of the transistor MN1 402a, the second controlled terminal 426b of the transistor MN2 402b and the output terminal 452. The second controlled terminal 466a is also coupled to the first terminal of the capacitor Co 454. The second controlled terminal 466b of the transistor MP1 462b is coupled to the control terminals 468a, 468b.

The circuit arrangement 400 further includes a current source 470 providing a current $I_d$, wherein a first terminal of the current source 470 is coupled to the control terminals 468a, 468b and the second controlled terminal 466b of the transistor MP1 462b, and a second terminal of the current source 470 is coupled to a voltage reference point $V_2$, which may be a ground terminal.

The gates or control terminals 428a, 428b of the transistors MN1 402a and MN2 402b are biased via the pseudo-resistors or resistive elements Rf1 430 and Rf2 432, respectively. Such an arrangement may keep or maintain the average drain current of the of the transistors MN1 402a and MN2 402b equal to approximately half of the bias current, $I_d$, of the current source 470. The bias current $I_d$ may be chosen to be low, thereby maintaining the gate voltage just above the threshold voltage, $V_{th}$, of the transistors MN1 402a and MN2 402b.

The transistors MP2 462a and MP1 462b function to provide the bias current mirror, whereby the bias current $I_d$ provided by the current source 470 in a branch of the current mirror circuit 460 associated with the transistor MP1 462b, is mirrored or reproduced as substantially $I_d$ in another branch of the current mirror circuit 460 associated with the transistor MP2 462a to be supplied to the transistors MN1 402a and MN2 402b.

The capacitors C1 420 and C2 422 provide direct current (DC) blocking from the respective input terminals 406, 408, and therefore their capacitance should be large compared to the gate capacitance of the transistors MN1 402a and MN2 402b in order to obtain maximum voltage swing at the respective control terminals 428a, 428b. The capacitor Co 454 acts to sustain the output voltage and may work as part of the low pass filter (e.g. 306) with an output resistance.

The circuit arrangement 400 provides a single-ended output, via the output terminal 452, so as to reduce the circuit complexity for low power considerations.

In various embodiments, using the transistor MN1 402a as a non-limiting example, when the signal amplitude at the input terminal 406 is low, the DC behaviour of the transistor MN1 402a biased via the resistive element Rf1 430 is at least substantially similar to a diode connected NMOS. The output voltage $V_{out}$ 453 is just above the threshold voltage. The DC biasing condition for the transistor MN1 402a is at least substantially similar to a zero $V_{th}$ (turn-on voltage) diode. Therefore, the circuit arrangement 400 or a detector including the circuit arrangement 400, includes an equivalent zero-$V_{th}$ diode configuration, which may alleviate the threshold voltage loss that is present in conventional detectors.

As the signal amplitude increases, the detector enters a strongly nonlinear regime. The transistor MN1 402a conducts most current when the gate voltage is above a threshold voltage, $V_{th}$. Since the drain current is limited by $I_d$, the transistor MN1 402a discharges the capacitor Co 454 and lowers the gate voltage until the average drain current through the transistor MN1 402a is at least substantially equal to $I_d$. If the drain current is large compared to the bias current $I_d$ when the transistor MN1 402a is conducting, the transistor MN1 402a only conducts in certain periods or durations. The output voltage $V_{out}$ 453 then drops proportionally to the input peak amplitude, providing a detector gain of −1 V/V. The detector output voltage V$_{out}$ 453 may then be described according to $$V_{out} = V_{th} + \sqrt{I_d \cdot \frac{2}{\mu_n C_{ox}} \cdot \frac{L}{W} - \frac{A^2}{2}},$$ (Equation 1)

where A is the peak amplitude of a sinusoidal waveform input signal (e.g. input signal, V$_{RF}$=A sin(ωt)), W and L are the transistor width and length and μ$_n$ (electron mobility), C$_{ox}$ (gate oxide capacitance per unit area) and V$_{th}$ (transistor threshold voltage) are process dependent device parameters.

The currents in the transistors MN1 402a and MN2 402b may be limited and the detector gain may be slightly lower. In addition, the resistive elements Rf1 430 and Rf2 432 are chosen to be relatively large to provide DC biasing at the respective control terminals 428a, 428b, and a small AC gain from the respective gates or control terminals 428a, 428b to the respective drains or second controlled terminals 426a, 426b. For each of the resistive elements Rf1 430 and Rf2 432, two diode connected PMOS in series, transistors MPR1 434a, MPR2 434b and transistors MPR3 442a, MPR4 442b, constitute pseudo resistors to serve as mega-ohms resistors without loading the output, and providing DC biasing at the control terminals (gate) 428a, 428b, with small parasitic effects (e.g. parasitic capacitance).

In general, the higher carrier frequency a detector uses, the more power burden it suffers in the RF gain amplification. A detector (e.g. envelope detector) employing the circuit arrangement 400 may be advantageously carrier frequency insensitive.

Figure 5:
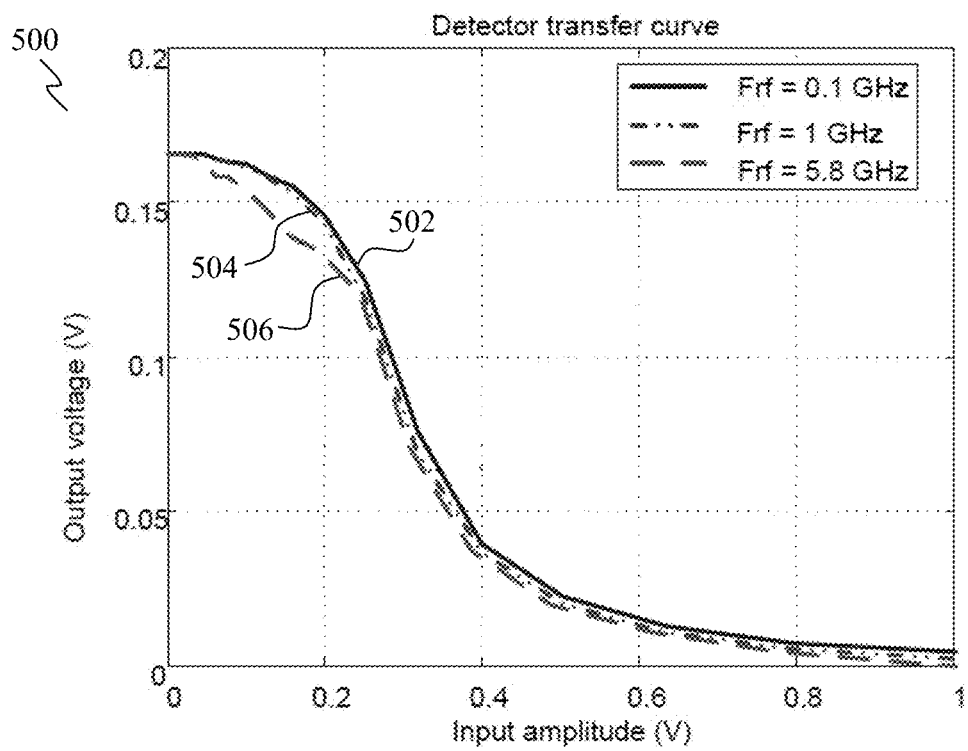
FIG. 5 shows a plot of detector transfer curve illustrating the relationship between the output voltage $V_{out}$ and the input voltage $V_{RF}$ for different carrier frequencies, according to various embodiments.

FIG. 5 shows a plot 500 of detector transfer curve illustrating the relationship between the output voltage V$_{out}$ and the input voltage V$_{RF}$ for different carrier frequencies, according to various embodiments. The plot 500 shows the results for the carrier frequencies, Frf, of 0.1 GHz 502, 1 GHz 504 and 5.8 GHz 506. The plot 500 shows that V$_{out}$ is a function of only the amplitude of the input voltage V$_{RF}$, and is independent of the carrier frequency, Frf. Therefore, RF detection by the detector of various embodiments is independent of the operating carrier frequency. The results show that the detector of various embodiments demonstrates its suitable applications in any carrier frequencies, for high sensitivity RF detection independent of the operating carrier frequencies or without carrier frequency limitation. However, this also means that the detector faces the challenges of non-selectivity.

In order to provide good selectivity to out-of-band noise and interferences, a LC matching network or circuit of the inductors Lg1 410, Ls 412, Lg2 414, and the capacitors Cex1 416 and Cex2 418 as described in the context of the circuit arrangement 400 may be provided. The capacitors Cex1 416 and Cex2 418 are added to provide additional design freedom. The LC matching network may supply a stable impedance match to a 50 ohms input source and also provides a narrow RF filter (e.g. 302, FIG. 3) to remove out-of-band noise and interfering signals. The impedance, Z$_{in}$, for the input matching network in the RF detector may be described according to $$Z_{in} = \frac{g_m L_s}{C_{ex} + C_{gs}} + j\left[\omega(L_s + L_g) - \frac{1}{\omega(C_{ex} + C_{gs})}\right],$$ (Equation 2)

where C$_{gs}$ and g$_m$ are the respective parasitic gate-to-source capacitance and the transconductance of the respective transistors MN1 402a, MN2 402b.

An input match at the resonant frequency, ω$_0$, is achieved by equating the real part of Z$_{in}$ to the source impedance, R$_s$, and the imaginary part to zero, as expressed respectively in Equations 3 and 4 below:

$$R_s = \frac{g_m L_s}{C_{ex} + C_{gs}},$$ (Equation 3)

$$\omega_0 = \frac{1}{\sqrt{(L_s + L_g)(C_{ex} + C_{gs})}}.$$ (Equation 4)

Figure 6:
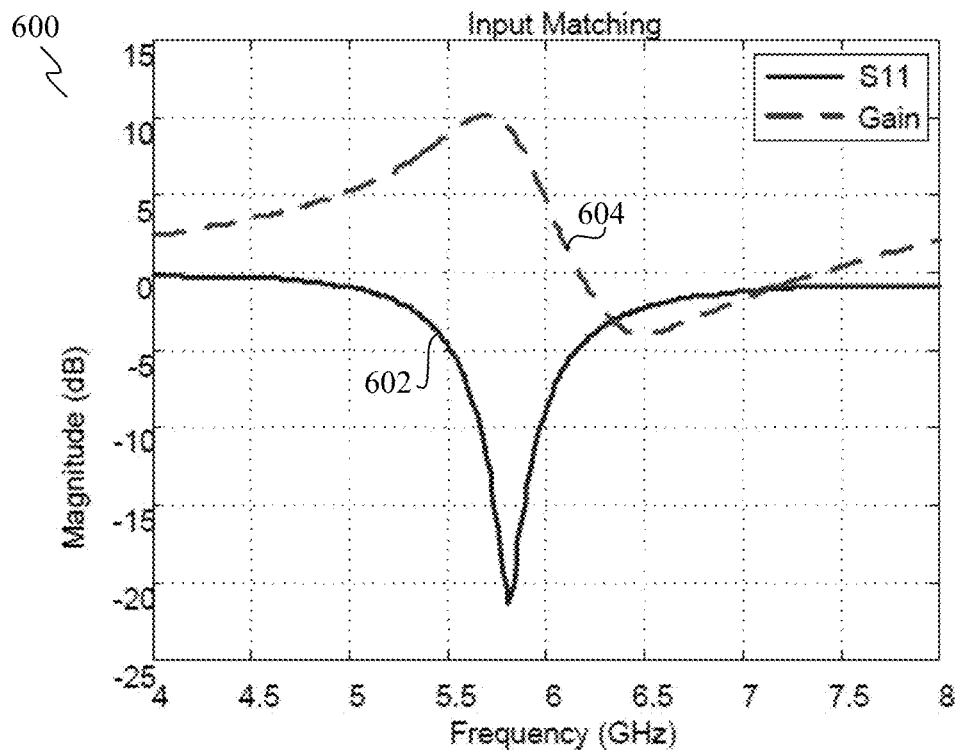
FIG. 6 shows a plot of simulated S11 and gain of an input matching circuit, according to various embodiments.

FIG. 6 shows a plot 600 of simulated S11 602 and gain 604 of an input matching circuit, according to various embodiments, from an antenna to an input of the detector of various embodiments, including bonding wires and pad parasitic capacitance. The parameter S11 refers to the return loss or the power reflected from the antenna. The detector input transistor (e.g. MN1 402a, MN2 402b) may be sensitive to voltage, and the impedance transformation additionally provides additional passive voltage gain, approximately 10 dB, based on the quality factor of the input matching circuit.

Another consideration is the output bandwidth, which is determined by the output pole. From large signal analysis, the output signal is the squared version of the input signal, and is filtered through the low pass filter formed by the detector output resistance and the capacitor Co (e.g. 454, FIG. 4). The bandwidth at the output is set by the pole at f$_{p,det}$ formed by the capacitor Co (e.g. 454, FIG. 4) and the output impedance of the detector, which is approximately 1/g$_m$, neglecting the body effect, and may be expressed as $$f_{p,det} = \frac{g_m}{2\pi C_0},$$ (Equation 5)

where g$_m$ is the transconductance of the respective transistors MN1 402a, MN2 402b.

This pole is designed to be low enough to filter out any signal at the fundamental and higher harmonics, while still affording enough bandwidth to avoid or minimise attenuating the baseband signal. At the output port or terminal, only low frequency components may be observed. In various embodiments, for an OOK signal, the detected baseband waveform may be a square wave with a given baseband data rate, so the detector bandwidth should be high enough to avoid filtering this desired signal.

Furthermore, in various embodiments, the transistors MN1 402a, MN2 402b may be sized larger in order to lower or minimise the flicker noise, if it becomes dominant in the overall receiver noise calculation.

The conversion gain of the detector (e.g. envelope detector) of various embodiments will now be described. Due to the nonlinear nature of the envelope detector, there are challenges in analyzing the linear noise figure, NF. The following provides a non-limiting example to analyze the sensitivity of an envelope detection receiver.

The first step is to determine the nonlinear response of the envelope detector. Firstly, the large signal drain current, I$_{dc}$, of the transistor MN1 402a in saturation with an input signal V$_{RF}$=A sin(ωt) may be determined as described by:

$$I_{dc} = \frac{K}{2}[V_{out} + QA \sin(\omega t) - V_{th}]^2, \quad \text{(Equation 6)}$$

where $$K = \mu_n C_{ox} \frac{W}{L},$$

which is a constant depending on the fabrication process and device size, W and L are the transistor (e.g. MN1 402a) width and length, $\mu_n$ and $C_{ox}$ are process dependent device parameters, $V_{out}$ is the detector output voltage, $V_{th}$ is the threshold voltage (e.g. of the transistor MN1 402a), Q is the quality factor of the input matching circuit, A and $\omega$ are respectively the peak amplitude and frequency of the input signal $V_{RF}$, and t is time.

Next, the DC output signal current, $I_{d,Dc}$, and the high order harmonic term may be filtered by the detector output pole, providing a DC output current, $I_{d,Dc}$, as described by:

$$I_{d,DC} = \frac{K}{2}\left[(V_{out} - V_{th})^2 + \frac{Q^2 A^2}{2}\right]. \quad \text{(Equation 7)}$$

By re-arranging the terms in Equation 7, the DC output voltage, $V_{out}$, may be determined as $$V_{out} = V_{th} + \sqrt{\frac{2I_{d,DC}}{K} - \frac{Q^2 A^2}{2}} = kA, \quad \text{(Equation 8)}$$

where k is the voltage conversion gain.

The voltage conversion gain, k, from the peak AC input amplitude A to output DC voltage $V_{out}$ may be determined by $$k = \frac{\partial V_{out}}{\partial A} = -\frac{1}{2} \frac{Q^2 A}{\sqrt{\frac{2I_{d,DC}}{K} - \frac{Q^2 A^2}{2}}} \approx -\frac{\sqrt{2}}{4}\sqrt{\frac{K}{I_{d,DC}}} Q^2 A. \quad \text{(Equation 9)}$$

Expanding k in a Taylor series and focusing on the first order term, the voltage conversion gain, k, as expressed in Equation 9, may be better approximated to get the design intuition.

Figure 7:
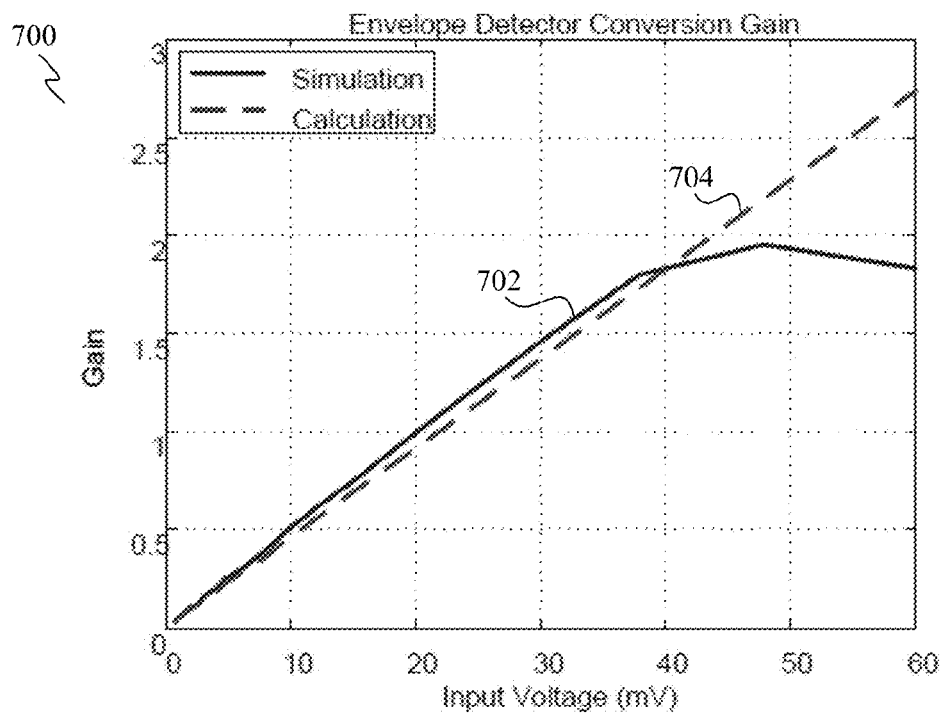
FIG. 7 shows a plot of simulated and calculated detector voltage conversion gain, k, according to various embodiments.

FIG. 7 shows a plot 700 of simulated detector voltage conversion gain, k 702 and calculated voltage conversion gain, k 704 (based on Equation 9), according to various embodiments, based on an example of a Chartered 0.18 μm CMOS with supply voltage, VDD=0.5V. The plot 700 illustrates that the calculated results 704 based on the simplified k of Equation 9 shows a good match with the simulation results 702 for small input voltage amplitudes (e.g. between 0 to 40 mV).

The sensitivity of the detector (e.g. envelope detector) of various embodiments will now be described. The ultimate sensitivity may be determined by analyzing the noise contributions and gain factors to the detector output and calculating an effective noise figure, NF, that depends on the input signal power. The noise of the envelope detector itself, due to the transistors MN1 (e.g. 402a, FIG. 4), MN2 (e.g. 402b, FIG. 4), MP2 (e.g. 462a, FIG. 4), and the resistive elements Rf1 (e.g. 430, FIG. 4), and Rf2 (e.g. 432, FIG. 4), appears directly at the output. This noise, $N_{o,ED}$ (V²/Hz), may be determined as described by $$N_{o,ED} = 2 \cdot \frac{4kT\gamma}{g_{mn}}\left(1 + \frac{g_{mp}}{g_{mn}}\right) + 2 \cdot \frac{4kT}{R_f g_{mn}^2}, \quad \text{(Equation 10)}$$

where k is the Boltzmann constant, T is temperature, γ is the coefficient for MOSFET noise, $g_{mn}$ is the transconductance of the respective transistors MN1 402a, MN2 402b, $g_{mp}$ is the transconductance of the transistor MP2 462a, and $R_f$ is the resistance of the respective resistive elements Rf1 430, Rf2 432.

Figure 8:
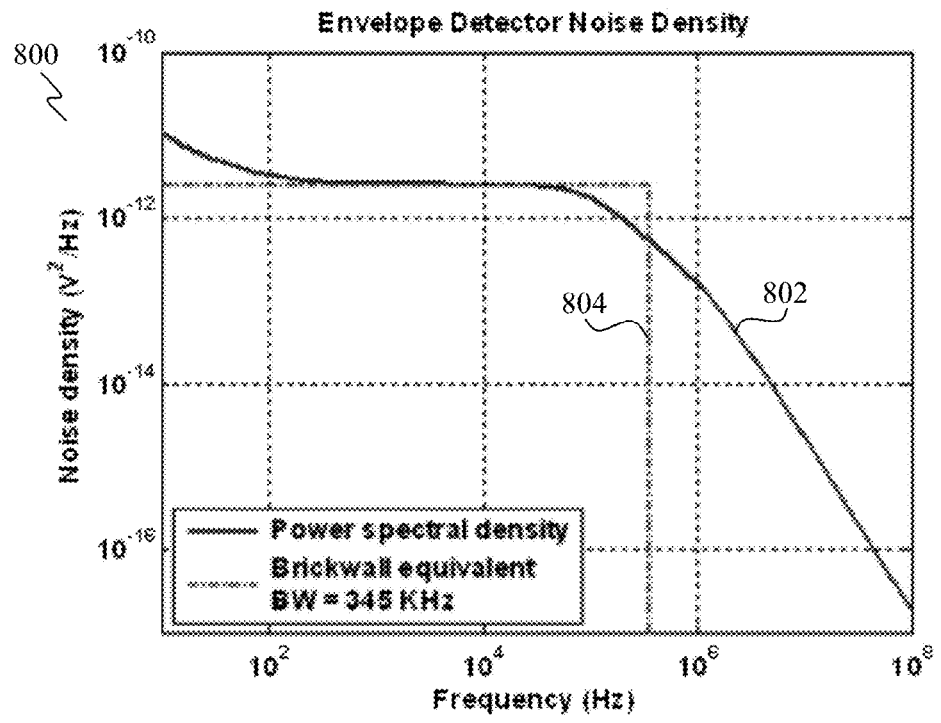
FIG. 8 shows a plot of simulated detector output noise, according to various embodiments.

FIG. 8 shows a plot 800 of simulated detector output noise 802 of the detector of various embodiments. The simulated noise may be integrated over the entire band and normalized to the detector bandwidth in order to approximate an equivalent brickwall noise density 804 in a 1 Hz bandwidth, as shown in FIG. 8. The equivalent noise density 804 may then be used in the noise factor calculation.

The total noise factor, F, of the detector may then be expressed as $$F = \frac{N_{RS}k^2 + N_{o,ED}}{N_{RS}k^2}, \quad \text{(Equation 11)}$$

where $N_{RS}$ is the noise from the source resistance (=4kTR_s, where k is the Boltzmann constant, T is temperature, and $R_s$ is the source resistance) and k is the conversion gain.

Due to the dependence of the conversion gain k on signal level, F increases with decreasing input power. Using NF=10 log F and the detector bandwidth $BW_{det}$ as a non-limiting example, the input-referred noise, $P_{n,in}$, for the receiver in dBm may be determined by $$P_{n,in} = -174 + 10 \log(BW_{det}) + NF \quad \text{(Equation 12)}.$$

If the minimum signal-to-noise ratio (SNR) for reliable detection is $SNR_{min}$, the minimum detectable signal, $P_{mds}$, is the input power for which may be determined by $$P_{mds} = P_{n,in} + SNR_{min} \quad \text{(Equation 13)}.$$

The relationship as described by Equation 13 may be visualized by plotting the noise power $P_{n,in}$ and ($P_{in}$–$SNR_{min}$) versus $P_{in}$, where $P_{in}$ is the input power, and locating the intersection.

Figure 9:
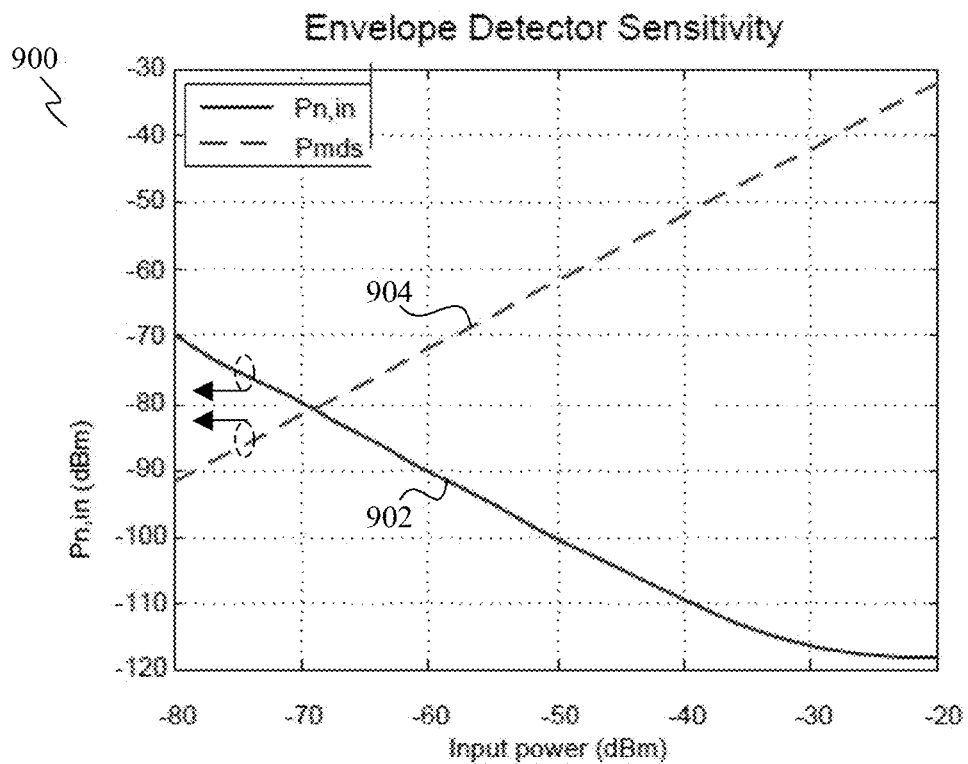
FIG. 9 shows a plot of detector sensitivity, according to various embodiments.

FIG. 9 shows a plot 900 of detector sensitivity, according to various embodiments, for $P_{n,in}$ 902 and $P_{mds}$ 904. For a value of 12 dB for $SNR_{min}$ (bit error rate, BER=10⁻³ for OOK), $P_{mds}$ may be found to be approximately –70 dBm, as shown in FIG. 9.

Figure 10:
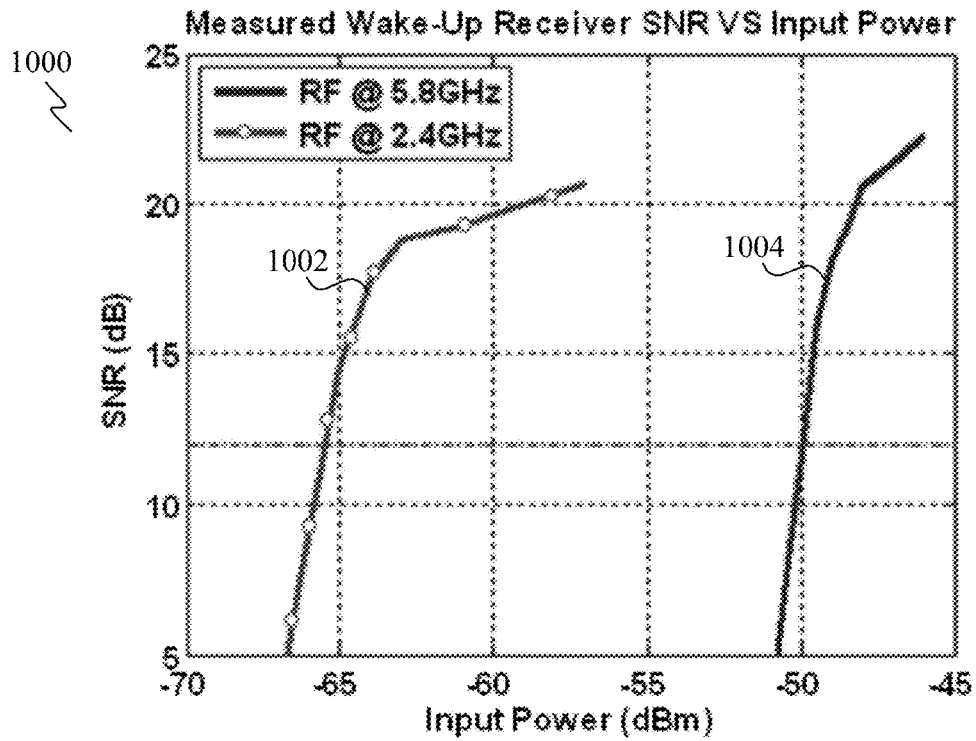
FIG. 10 shows a plot of detector signal-to-noise ratio (SNR) as a function of input power for different carrier frequencies, according to various embodiments.

FIG. 10 shows a plot 1000 of detector signal-to-noise ratio (SNR) as a function of input power for different carrier frequencies, according to various embodiments. The plot 1000 shows the results for frequencies at about 2.4 GHz 1002 and about 5.8 GHz 1004. Based on a bit error rate, BER=10⁻³ for OOK (SNR=12 dB), the detector achieves a sensitivity of about –65 dBm sensitivity at 2.4 GHz and about –50 dBm at 5.8 GHz.

The performance of the detector or wake-up receiver of various embodiments is summarised in Table 1. The RF detector of various embodiments may achieve high sensitivity and moderate selectivity, without RF gain amplifier stage, with a power consumption of about 10 μW or under.

TABLE 1

| Parameter | |
|---|---|
| Process | 0.18 μm CMOS |
| Sensitivity (dBm) | −70 |
| Carrier frequency (GHz) | 5.8 |
| Data rate (KHz) | 100 |
| Voltage (V) | 0.5 |
| Power (μW) | 10 |

FIG. 11 shows a schematic of a circuit arrangement 1100 for a radio frequency (RF) detector, according to various embodiments. The circuit arrangement 1100 may be implemented, for example, for the active radio frequency (RF) detector (e.g. amplitude detector or envelope detector) 304 (FIG. 3). An RF detector employing the circuit arrangement 1100 may be a fully differential RF detector. The circuit arrangement 1100 includes two parts: an amplitude detector based on the nonlinear behavior of MOS devices at the transition from weak to strong inversion, and an LC (inductor-capacitor) network for input matching. The LC network may also function as a RF filter (e.g. as the bandpass filter 302, FIG. 3).

The circuit arrangement 1100 includes transistors (e.g. NMOS transistors) MN1 1102a and MN2 1102b, and transistors (e.g. PMOS transistors) MP1 1124a and MP2 1124b, to provide fully-differential circuits to sense differential inputs $V_{RF+}$ 1104, $V_{RF-}$ 1105, received through a "positive" input terminal 1106 and a "negative" input terminal 1108, which are robust to common mode noise, and which are matched to an antenna (e.g. 312, FIG. 3) (not shown) with a matching circuit of an LC network having the inductors (L) Lg1 1100, Ls 1111, Lg2 1112, and the capacitors (C) Cex1 1113, Cex2 1114, Cex3 1115, Cex4 1116. The matching circuit is coupled to the input terminal 1106, the input terminal 1108, the transistor MN1 1102a, the transistor MN2 1102b, the transistor MP1 1124a and the transistor MP2 1124b.

The transistor MN1 1102a includes a first controlled terminal (e.g. source terminal) 1118a, a second controlled terminal (e.g. drain terminal) 1120a and a control terminal (e.g. gate terminal) 1122a, and the transistor MN2 1102b includes a first controlled terminal (e.g. source terminal) 1118b, a second controlled terminal (e.g. drain terminal) 1120b and a control terminal (e.g. gate terminal) 1122b.

The first controlled terminals 1118a, 1118b are coupled to each other. The second controlled terminals 1120a, 1120b are coupled to each other. The control terminal 1122a is coupled to the input terminal 1106 and the control terminal 1122b is coupled to the input terminal 1108. The control terminal 1122a is also coupled to the inductor Lg1 1110, and the control terminal 1122b is also coupled to the inductor Lg2 1112.

The transistor MP1 1124a includes a first controlled terminal (e.g. source terminal) 1126a, a second controlled terminal (e.g. drain terminal) 1128a and a control terminal (e.g. gate terminal) 1130a, and the transistor MP2 1124b includes a first controlled terminal (e.g. source terminal) 1126b, a second controlled terminal (e.g. drain terminal) 1128b and a control terminal (e.g. gate terminal) 1130b.

The first controlled terminals 1126a, 1126b are coupled to each other. The second controlled terminals 1128a, 1128b are coupled to each other. The control terminal 1130a is coupled to the input terminal 1106 and the control terminal 1130b is coupled to the input terminal 1108. The control terminal 1130a is also coupled to the inductor Lg1 1110, and the control terminal 1130b is also coupled to the inductor Lg2 1112.

The inductor Lg1 1110 includes a first terminal coupled to the input terminal 1106, and a second terminal coupled to the control terminal 1122a of the transistor MN1 1102a and the control terminal 1130a of the transistor MP1 1124a. The inductor Ls 1111 includes a first terminal coupled to the first controlled terminal 1118a of the transistor MN1 1102a, the first controlled terminal 1118b of the transistor MN2 1102b, the first controlled terminal 1126a of the transistor MP1 1124a and the first controlled terminal 1126b of the transistor MP2 1124b. The inductor Lg2 1112 includes a first terminal coupled to the control terminal 1122b of the transistor MN2 1102b and the control terminal 1130b of the transistor MP2 1124b, and a second terminal coupled to the input terminal 1108. The capacitor Cex1 1113 is coupled between the control terminal 1122a and the first controlled terminal 1118a, the capacitor Cex2 1114 is coupled between the control terminal 1122b and the first controlled terminal 1118b, the capacitor Cex3 1115 is coupled between the control terminal 1130a and the first controlled terminal 1126a, and the capacitor Cex4 1116 is coupled between the control terminal 1130b and the first controlled terminal 1126b.

The input matching circuit may further include a capacitor Cs 1117, wherein a first terminal of the capacitor Cs 1117 is coupled to the second terminal of the inductor Ls 1111, and a second terminal of the capacitor Cs 1117 is coupled to a voltage reference point $V_1$, which may be a ground terminal.

The circuit arrangement 1100 further includes a resistive element Rf1 1132 coupled between the control terminal 1122a and the second controlled terminal 1120a, a resistive element Rf2 1134 coupled between the control terminal 1122b and the second controlled terminal 1120b, a resistive element Rf3 1136 coupled between the control terminal 1130a and the second controlled terminal 1128a, and a resistive element Rf4 1138 coupled between the control terminal 1130b and the second controlled terminal 1128b. The resistive element Rf1 1132, the resistive element Rf2 1134, the resistive element Rf3 1136 and the resistive element Rf4 1138 may be at least substantially same.

The resistive element Rf1 1132 includes transistors (e.g. PMOS transistors) MPR1 1140a and MPR2 1140b. The transistor MPR1 1140a includes a first controlled terminal (e.g. source terminal) 1142a, a second controlled terminal (e.g. drain terminal) 1144a, a control terminal (e.g. gate terminal) 1146a, and a bulk terminal 1147a, and the transistor MPR2 1140b includes a first controlled terminal (e.g. source terminal) 1142b, a second controlled terminal (e.g. drain terminal) 1144b, a control terminal (e.g. gate terminal) 1146b, and a bulk terminal 1147b.

The first controlled terminals 1142a, 1142b are coupled to each other. The second controlled terminal 1144a of the transistor MPR1 1140a is coupled to the control terminal 1122a of the transistor MN1 1102a. The second controlled terminal 1144b of the transistor MPR2 1140b is coupled to the second controlled terminal 1120a of the transistor MN1 1102a. The control terminal 1146a is coupled to the second controlled terminal 1144a. The control terminal 1146b is coupled to the second controlled terminal 1144b. The bulk terminals 1147a, 1147b are coupled to each other and also coupled to the first controlled terminals 1142a, 1142b.

The resistive element Rf2 1134 includes transistors (e.g. PMOS transistors) MPR3 1148a and MPR4 1148b. The transistor MPR3 1148a includes a first controlled terminal (e.g. source terminal) 1150a, a second controlled terminal (e.g. drain terminal) 1152a, a control terminal (e.g. gate terminal)

1154a, and a bulk terminal 1156a, and the transistor MPR4 1148b includes a first controlled terminal (e.g. source terminal) 1150b, a second controlled terminal (e.g. drain terminal) 1152b, a control terminal (e.g. gate terminal) 1154b, and a bulk terminal 1156b.

The first controlled terminals 1150a, 1150b are coupled to each other. The second controlled terminal 1152a of the transistor MPR3 1148a is coupled to the second controlled terminal 1120b of the transistor MN2 1102b. The second controlled terminal 1152b of the transistor MPR4 1148b is coupled to the control terminal 1122b of the transistor MN2 1102b. The control terminal 1154a is coupled to the second controlled terminal 1152a. The control terminal 1154b is coupled to the second controlled terminal 1152b. The bulk terminals 1156a, 1156b are coupled to each other and also coupled to the first controlled terminals 1150a, 1150b.

The resistive element Rf3 1136 includes transistors (e.g. PMOS transistors) MPR5 1158a and MPR6 1158b. The transistor MPR5 1158a includes a first controlled terminal (e.g. source terminal) 1160a, a second controlled terminal (e.g. drain terminal) 1162a, a control terminal (e.g. gate terminal) 1164a, and a bulk terminal 1166a, and the transistor MPR6 1158b includes a first controlled terminal (e.g. source terminal) 1160b, a second controlled terminal (e.g. drain terminal) 1162b, a control terminal (e.g. gate terminal) 1164b, and a bulk terminal 1166b.

The first controlled terminals 1160a, 1160b are coupled to each other. The second controlled terminal 1162a of the transistor MPR5 1158a is coupled to the control terminal 1130a of the transistor MP1 1124a. The second controlled terminal 1162b of the transistor MPR6 1158b is coupled to the second controlled terminal 1128a of the transistor MP1 1124a. The control terminal 1164a is coupled to the second controlled terminal 1162a. The control terminal 1164b is coupled to the second controlled terminal 1162b. The bulk terminals 1166a, 1166b are coupled to each other and also coupled to the first controlled terminals 1160a, 1160b.

The resistive element Rf4 1138 includes transistors (e.g. PMOS transistors) MPR7 1168a and MPR8 1168b. The transistor MPR7 1168a includes a first controlled terminal (e.g. source terminal) 1170a, a second controlled terminal (e.g. drain terminal) 1172a, a control terminal (e.g. gate terminal) 1174a, and a bulk terminal 1176a, and the transistor MPR8 1168b includes a first controlled terminal (e.g. source terminal) 1170b, a second controlled terminal (e.g. drain terminal) 1172b, a control terminal (e.g. gate terminal) 1174b, and a bulk terminal 1176b.

The first controlled terminals 1170a, 1170b are coupled to each other. The second controlled terminal 1172a of the transistor MPR7 1168a is coupled to the second controlled terminal 1128b of the transistor MP2 1124b. The second controlled terminal 1172b of the transistor MPR8 1168b is coupled to the control terminal 1130b of the transistor MP2 1124b. The control terminal 1174a is coupled to the second controlled terminal 1172a. The control terminal 1174b is coupled to the second controlled terminal 1172b. The bulk terminals 1176a, 1176b are coupled to each other and also coupled to the first controlled terminals 1170a, 1170b.

It should be appreciated that any one or each of the resistive element Rf1 1132, the resistive element Rf2 1134, the resistive element Rf3 1136 and the resistive element Rf4 1138 may also be at least substantially same, for example in terms of the arrangements of the PMOS transistors, as any one of the resistive element Rf1 430 (FIG. 4) or the resistive element Rf2 432 (FIG. 4) as described above.

The circuit arrangement 1100 may further include a capacitor C1 1178 coupled in series with the inductor Lg1 1110 and the control terminal 1122a of the transistor MN1 1102a (e.g. coupled between the second terminal of the inductor Lg1 1110 and the control terminal 1122a of the transistor MN1 1102a), a capacitor C2 1179 coupled in series with the inductor Lg2 1112 and the control terminal 1122b of the transistor MN2 1102b (e.g. coupled between the first terminal of the inductor Lg2 1112 and the control terminal 1122b of the transistor MN2 1102b), a capacitor C3 1180 coupled in series with the inductor Lg1 1110 and the control terminal 1130a of the transistor MP1 1124a (e.g. coupled between the second terminal of the inductor Lg1 1110 and the control terminal 1130a of the transistor MP1 1124a), and a capacitor C4 1181 coupled in series with the inductor Lg2 1112 and the control terminal 1130b of the transistor MP2 1124b (e.g. coupled between the first terminal of the inductor Lg2 1112 and the control terminal 1130b of the transistor MP2 1124b).

The circuit arrangement 400 further includes an output terminal 1182, from which an output signal (e.g. a baseband signal) $V_{on}$ 1183 may be extracted, coupled to the second controlled terminal 1120a of the transistor MN1 1102a and the second controlled terminal 1120b of the transistor MN2 1102b.

The circuit arrangement 400 further includes an output terminal 1184, from which an output signal (e.g. a baseband signal) $V_{op}$ 1185 may be extracted, coupled to the second controlled terminal 1128a of the transistor MP1 1124a and the second controlled terminal 1128b of the transistor MP2 1124b.

The circuit arrangement 1100 may further include a current source 1186 providing a current $I_{REF}$, wherein a first terminal of the current source 1186 is coupled to the second controlled terminal 1120a of the transistor MN1 1102a, the second controlled terminal 1120b of the transistor MN2 1102b and the output terminal 1182, and a second terminal of the current source 1186 is coupled to a voltage reference point $V_2$, which may be a power supply line.

In various embodiments, the circuit arrangement 1100 may further include a capacitor Con 1188, wherein a first terminal of the capacitor Con 1188 is coupled to the first terminal of the current source 1186 and the output terminal 1182, and a second terminal of the capacitor Con 1188 is coupled to a voltage reference point $V_1$, which may be a ground terminal.

The circuit arrangement 1100 may further include a resistor $R_{REF}$ 1190, wherein a first terminal of the resistor $R_{REF}$ 1190 is coupled to the second controlled terminal 1128a of the transistor MP1 1124a, the second controlled terminal 1128b of the transistor MP2 1124b and the output terminal 1184, and a second terminal of the resistor $R_{REF}$ 1190 is coupled to a voltage reference point $V_1$, which may be a ground terminal.

In various embodiments, the circuit arrangement 1100 may further include a capacitor Cop 1192, wherein a first terminal of the capacitor Cop 1192 is coupled to the first terminal of the $R_{REF}$ 1190 and the output terminal 1184, and a second terminal of the capacitor Cop 1192 is coupled to a voltage reference point $V_1$, which may be a ground terminal.

The gates or control terminals 1122a, 1122b, 1130a, 1130b of the transistors MN1 1102a, MN2 1102b, MP1 1124a, MP2 1124b are biased via the pseudo-resistors or resistive elements Rf1 1132, Rf2 1134, Rf3 1136, Rf4 1138 respectively.

The capacitors C1 1178 and C3 1180 provide direct current (DC) blocking from the input terminal 1106, and the capacitors C2 1179 and C4 1181 provide direct current (DC) blocking from the input terminal 1108, and therefore their capacitance should be large compared to the gate capacitance of the respective transistors MN1 1102a, MN2 1102b, MP1 1124a, MP2 1124b in order to obtain maximum voltage swing at the respective control terminals 1122a, 1122b, 1130a, 1130b. The capacitors Con 1188 and Cop 1192 act to sustain the output voltages and may work as part of the low pass filter (e.g. 306) with an output resistance.

It should be appreciated that the descriptions of features in the context of the circuit arrangement 400 of FIG. 4 that are similarly present in the circuit arrangement 1100, and also the associated results of FIGS. 5 to 10, may be applicable to the circuit arrangement 1100.

The circuit arrangement 1100 illustrates a fully differential implementation of the active RF detector of various embodiments, which may be robust or provide at least some immunity against common mode noise.

The circuit arrangement 400 (FIG. 4) illustrates an implementation of the active RF detector of various embodiments, including an amplitude detector having a pair of transistors MN1 402a, MN2 402b, and an LC matching circuit, with differential inputs $V_{RF+}$ 404, $V_{RF-}$ 405, received through a "positive" input terminal 406 and a "negative" input terminal 408, and a single-ended output $V_{out}$ 453 provided from the output terminal 452. The circuit arrangement 1100 (FIG. 11) illustrates an implementation of the active RF detector of various embodiments, including an amplitude detector having two pairs of transistors MN1 1102a, MN2 1102b, and MP1 1124a, MP2 1124b, and an LC matching circuit, with differential inputs $V_{RF+}$ 1104, $V_{RF-}$ 1105, received through a "positive" input terminal 1106 and a "negative" input terminal 1108, and differential outputs $V_{on}$ 1183, $V_{op}$ 1185 provided from the output terminals 1182, 1184. Therefore, the circuit arrangement 1100 is a fully differential implementation or version of the circuit arrangement 400, and may provide improved robustness or immunity against common mode noise.

Various embodiments may provide an ultra-low power wake-up receiver (RF receiver) based on the high sensitivity RF detector of various embodiments. The active RF detector of various embodiments, co-designed or embedded with an inductive source degeneration LC network or input matching network/circuit, provides high sensitivity and selectivity for the RF receiver. The input matching network or LC network provides selectivity and impedance matching to the antenna and also offers voltage gain via its quality factor.

As shown by the fully integrated schematic and system analysis, the sensitivity of the RF detector may achieve approximately −70 dBm, without power burden compared to conventional approaches, so as to achieve ultra-low power consumptions of about 10 μW. The receiver or detector of various embodiments may also be designed to be powered by ambient energy harvesting, without battery, and/or having an average current of about 10 nA and/or having an operating current of about 200 μA.

Various embodiments of the ultra-low power wake-up receiver includes a continuous-time sigma-delta analogue-to-digital converter (CT ΣΔ ADC) to provide oversampling to improve the signal to noise ratio (SNR) of the receiver.

Various embodiments of the receiver or detector offer low power and high carrier frequency operation with high sensitivity. Various embodiments of the receiver or detector may be employed in on-off keyed (OOK) and amplitude modulated (AM) applications.

Various embodiments may not require RF gain amplifiers in order to reduce power consumption. Therefore, a wake-up receiver with a high sensitivity detector, without RF amplification, may be power efficient. Various embodiments may also not require oscillators or additional external components.

While the invention has been particularly shown and described with reference to specific embodiments, it should be understood by those skilled in the art that various changes in form and detail may be made therein without departing from the spirit and scope of the invention as defined by the appended claims. The elements of the various embodiments may be incorporated into each of the other species to obtain the benefits of those elements in combination with such other species, and the various beneficial features may be employed in embodiments alone or in combination with each other. The scope of the invention is thus indicated by the appended claims and all changes which come within the meaning and range of equivalency of the claims are therefore intended to be embraced.

The invention claimed is:

1. A circuit arrangement, comprising:
a first input terminal and a second input terminal;
a first transistor and a second transistor, each of the first transistor and the second transistor having a first controlled terminal, a second controlled terminal and a control terminal, the first controlled terminal of the first transistor being coupled to the first controlled terminal of the second transistor, the control terminal of the first transistor being coupled to the first input terminal, the control terminal of the second transistor being coupled to the second input terminal, and the second controlled terminal of the first transistor being coupled to the second controlled terminal of the second transistor;
an input matching circuit coupled to the first input terminal, the second input terminal, the first transistor and the second transistor;
a first resistive element coupled between the control terminal of the first transistor and the second controlled terminal of the first transistor;
a second resistive element coupled between the control terminal of the second transistor and the second controlled terminal of the second transistor; and
an output terminal coupled to the second controlled terminal of the first transistor and the second controlled terminal of the second transistor;
wherein the input matching circuit comprises a first inductor, a second inductor, a third inductor, a first capacitor and a second capacitor;
wherein the first inductor is coupled between the first input terminal and the control terminal of the first transistor;
wherein the second inductor is coupled between the first controlled terminal of the first transistor and the first controlled terminal of the second transistor;
wherein the third inductor is coupled between the second input terminal and the control terminal of the second transistor;
wherein the first capacitor is coupled between the control terminal of the first transistor and the first controlled terminal of the first transistor; and
wherein the second capacitor is coupled between the control terminal of the second transistor and the first controlled terminal of the second transistor.

2. The circuit arrangement of claim 1, further comprising:
a third capacitor coupled in series with the first input terminal and the first inductor; and
a fourth capacitor coupled in series with the second input terminal and the third inductor.

3. The circuit arrangement of claim 1,
wherein the first resistive element comprises:
a third transistor and a fourth transistor, each of the third transistor and the fourth transistor having a first controlled terminal, a second controlled terminal, a control terminal and a bulk terminal;

wherein the first controlled terminal of the third transistor is coupled to the first controlled terminal of the fourth transistor;

wherein the second controlled terminal of the third transistor is coupled to the control terminal of the first transistor, and the second controlled terminal of the fourth transistor is coupled to the second controlled terminal of the first transistor;

wherein the bulk terminal of the third transistor is coupled to the second controlled terminal of the third transistor, and the bulk terminal of the fourth transistor is coupled to the second controlled terminal of the fourth transistor; and wherein the control terminal of the third transistor is coupled to the control terminal of the fourth transistor, the first controlled terminal of the third transistor and the first controlled terminal of the fourth transistor.

4. The circuit arrangement of claim 1,
wherein the second resistive element comprises:
a fifth transistor and a sixth transistor, each of the fifth transistor and the sixth transistor having a first controlled terminal, a second controlled terminal, a control terminal and a bulk terminal;
wherein the first controlled terminal of the fifth transistor is coupled to the first controlled terminal of the sixth transistor;
wherein the second controlled terminal of the fifth transistor is coupled to the second controlled terminal of the second transistor, and the second controlled terminal of the sixth transistor is coupled to the control terminal of the second transistor;
wherein the bulk terminal of the fifth transistor is coupled to the second controlled terminal of the fifth transistor, and the bulk terminal of the sixth transistor is coupled to the second controlled terminal of the sixth transistor; and
wherein the control terminal of the fifth transistor is coupled to the control terminal of the sixth transistor, the first controlled terminal of the fifth transistor and the first controlled terminal of the sixth transistor.

5. The circuit arrangement of claim 1, further comprising a current mirror circuit coupled to the second controlled terminal of the first transistor, the second controlled terminal of the second transistor, and the output terminal.

6. The circuit arrangement of claim 5,
wherein the current mirror circuit comprises:
a seventh transistor and an eighth transistor, each of the seventh transistor and the eighth transistor having a first controlled terminal, a second controlled terminal and a control terminal;
wherein the first controlled terminal of the seventh transistor and the first controlled terminal of the eighth transistor are coupled to a first voltage reference point;
wherein the control terminal of the seventh transistor is coupled to the control terminal of the eighth transistor;
wherein the second controlled terminal of the seventh transistor is coupled to the second controlled terminal of the first transistor, the second controlled terminal of the second transistor and the output terminal; and
wherein the second controlled terminal of the eighth transistor is coupled to the control terminal of the seventh transistor and the control terminal of the eighth transistor.

7. The circuit arrangement of claim 6, further comprising a current source having a first terminal and a second terminal, wherein the first terminal of the current source is coupled to the control terminal of the seventh transistor, the control terminal of the eighth transistor and the second controlled terminal of the eighth transistor, and the second terminal of the current source is coupled to a second voltage reference point.

8. A receiver comprising a circuit arrangement of claim 1.

9. A circuit arrangement, comprising:
a first input terminal and a second input terminal;
a first transistor and a second transistor, each of the first transistor and the second transistor having a first controlled terminal, a second controlled terminal and a control terminal, the first controlled terminal of the first transistor being coupled to the first controlled terminal of the second transistor, the control terminal of the first transistor being coupled to the first input terminal, the control terminal of the second transistor being coupled to the second input terminal, and the second controlled terminal of the first transistor being coupled to the second controlled terminal of the second transistor;
a third transistor and a fourth transistor, each of the third transistor and the fourth transistor having a first controlled terminal, a second controlled terminal and a control terminal, the first controlled terminal of the third transistor being coupled to the first controlled terminal of the fourth transistor, the control terminal of the third transistor being coupled to the first input terminal, the control terminal of the fourth transistor being coupled to the second input terminal, and the second controlled terminal of the third transistor being coupled to the second controlled terminal of the fourth transistor;
an input matching circuit coupled to the first input terminal, the second input terminal, the first transistor, the second transistor, the third transistor and the fourth transistor;
a first resistive element coupled between the control terminal of the first transistor and the second controlled terminal of the first transistor;
a second resistive element coupled between the control terminal of the second transistor and the second controlled terminal of the second transistor;
a third resistive element coupled between the control terminal of the third transistor and the second controlled terminal of the third transistor;
a fourth resistive element coupled between the control terminal of the fourth transistor and the second controlled terminal of the fourth transistor;
a first output terminal coupled to the second controlled terminal of the first transistor and the second controlled terminal of the second transistor; and
a second output terminal coupled to the second controlled terminal of the third transistor and the second controlled terminal of the fourth transistor;
wherein the input matching circuit comprises a first inductor, a second inductor, a third inductor, a first capacitor, a second capacitor, a third capacitor and a fourth capacitor;
wherein the first inductor comprises a first terminal coupled to the first input terminal, and a second terminal coupled to the control terminal of the first transistor and the control terminal of the third transistor;
wherein the second inductor comprises a first terminal coupled to the first controlled terminal of the first transistor, the first controlled terminal of the second transistor, the first controlled terminal of the third transistor and the first controlled terminal of the fourth transistor;

wherein the third inductor comprises a first terminal coupled to the control terminal of the second transistor and the control terminal of the fourth transistor, and a second terminal coupled to the second input terminal;

wherein the first capacitor is coupled between the control terminal of the first transistor and the first controlled terminal of the first transistor;

wherein the second capacitor is coupled between the control terminal of the second transistor and the first controlled terminal of the second transistor;

wherein the third capacitor is coupled between the control terminal of the third transistor and the first controlled terminal of the third transistor; and wherein the fourth capacitor is coupled between the control terminal of the fourth transistor and the first controlled terminal of the fourth transistor.

10. The circuit arrangement of claim 9,
wherein the input matching circuit further comprises a fifth capacitor having a first terminal and a second terminal, wherein the first terminal of the fifth capacitor is coupled to a second terminal of the second inductor of the input matching circuit, and the second terminal of the fifth capacitor is coupled to a first voltage reference point.

11. The circuit arrangement of claim 9, further comprising:
a sixth capacitor coupled in series with the first inductor and the control terminal of the first transistor;
a seventh capacitor coupled in series with the third inductor and the control terminal of the second transistor;
an eighth capacitor coupled in series with the first inductor and the control terminal of the third transistor; and
a ninth capacitor coupled in series with the third inductor and the control terminal of the fourth transistor.

12. The circuit arrangement of claim 9,
wherein the first resistive element comprises:
a fifth transistor and a sixth transistor, each of the fifth transistor and the sixth transistor having a first controlled terminal, a second controlled terminal, a control terminal and a bulk terminal;
wherein the first controlled terminal of the fifth transistor is coupled to the first controlled terminal of the sixth transistor;
wherein the second controlled terminal of the fifth transistor is coupled to the control terminal of the first transistor, and the second controlled terminal of the sixth transistor is coupled to the second controlled terminal of the first transistor;
wherein the control terminal of the fifth transistor is coupled to the second controlled terminal of the fifth transistor, and the control terminal of the sixth transistor is coupled to the second controlled terminal of the sixth transistor; and
wherein the bulk terminal of the fifth transistor is coupled to the bulk terminal of the sixth transistor, the first controlled terminal of the fifth transistor and the first controlled terminal of the sixth transistor.

13. The circuit arrangement of claim 9,
wherein the second resistive element comprises:
a seventh transistor and an eighth transistor, each of the seventh transistor and the eighth transistor having a first controlled terminal, a second controlled terminal, a control terminal and a bulk terminal;
wherein the first controlled terminal of the seventh transistor is coupled to the first controlled terminal of the eighth transistor;
wherein the second controlled terminal of the seventh transistor is coupled to the second controlled terminal of the second transistor, and the second controlled terminal of the eighth transistor is coupled to the control terminal of the second transistor;

wherein the control terminal of the seventh transistor is coupled to the second controlled terminal of the seventh transistor, and the control terminal of the eighth transistor is coupled to the second controlled terminal of the eighth transistor; and wherein the bulk terminal of the seventh transistor is coupled to the bulk terminal of the eighth transistor, the first controlled terminal of the seventh transistor and the first controlled terminal of the eighth transistor.

14. The circuit arrangement of claim 9,
wherein the third resistive element comprises:
a ninth transistor and a tenth transistor, each of the ninth transistor and the tenth transistor having a first controlled terminal, a second controlled terminal, a control terminal and a bulk terminal;
wherein the first controlled terminal of the ninth transistor is coupled to the first controlled terminal of the tenth transistor;
wherein the second controlled terminal of the ninth transistor is coupled to the control terminal of the third transistor, and the second controlled terminal of the tenth transistor is coupled to the second controlled terminal of the third transistor;
wherein the control terminal of the ninth transistor is coupled to the second controlled terminal of the ninth transistor, and the control terminal of the tenth transistor is coupled to the second controlled terminal of the tenth transistor; and
wherein the bulk terminal of the ninth transistor is coupled to the bulk terminal of the tenth transistor, the first controlled terminal of the ninth transistor and the first controlled terminal of the tenth transistor.

15. The circuit arrangement of claim 9,
wherein the fourth resistive element comprises:
an eleventh transistor and a twelfth transistor, each of the eleventh transistor and the twelfth transistor having a first controlled terminal, a second controlled terminal, a control terminal and a bulk terminal;
wherein the first controlled terminal of the eleventh transistor is coupled to the first controlled terminal of the twelfth transistor;
wherein the second controlled terminal of the eleventh transistor is coupled to the second controlled terminal of the fourth transistor, and the second controlled terminal of the twelfth transistor is coupled to the control terminal of the fourth transistor;
wherein the control terminal of the eleventh transistor is coupled to the second controlled terminal of the eleventh transistor, and the control terminal of the twelfth transistor is coupled to the second controlled terminal of the twelfth transistor; and
wherein the bulk terminal of the eleventh transistor is coupled to the bulk terminal of the twelfth transistor, the first controlled terminal of the eleventh transistor and the first controlled terminal of the twelfth transistor.

16. The circuit arrangement of claim 9, further comprising a current source having a first terminal and a second terminal, wherein the first terminal of the current source is coupled to the second controlled terminal of the first transistor, the second controlled terminal of the second transistor and the first output terminal, and the second terminal of the current source is coupled to a second voltage reference point.

17. The circuit arrangement of claim 16, further comprising a tenth capacitor having a first terminal and a second terminal, wherein the first terminal of the tenth capacitor is coupled to the first terminal of the current source and the first output terminal, and the second terminal of the tenth capacitor is coupled to the first voltage reference point.

18. The circuit arrangement of claim 9, further comprising a resistor having a first terminal and a second terminal, wherein the first terminal of the resistor is coupled to the second controlled terminal of the third transistor, the second controlled terminal of the fourth transistor and the second output terminal, and the second terminal of the resistor is coupled to a first voltage reference point.

19. The circuit arrangement of claim 18, further comprising an eleventh capacitor having a first terminal and a second terminal, wherein the first terminal of the eleventh capacitor is coupled to the first terminal of the resistor and the second output terminal, and the second terminal of the eleventh capacitor is coupled to the first voltage reference point.

20. A receiver comprising a circuit arrangement of claim 9.

* * * * *